United States Patent [19]
Fujii et al.

[11] Patent Number: 5,731,698
[45] Date of Patent: Mar. 24, 1998

[54] APPARATUS FOR DETECTING THE AMPLITUDE AND PHASE OF AN A.C. SIGNAL

[75] Inventors: Toshiyuki Fujii; Shinzo Tamai; Hatsuhiko Naitoh; Naohiro Toki, all of Hyogo, Japan

[73] Assignees: The Kansai Electric Power Co., Inc., Osaka; Mitsubishi Denki Kabushiki Kaisha, Tokyo, both of Japan

[21] Appl. No.: 563,641

[22] Filed: Nov. 28, 1995

Related U.S. Application Data

[62] Division of Ser. No. 331,366, Oct. 27, 1994, Pat. No. 5,498,955.

[30] Foreign Application Priority Data

Feb. 10, 1994 [JP] Japan ................. 6-16607

[51] Int. Cl.$^6$ .................................. G01R 25/00
[52] U.S. Cl. ...................... 324/76.77; 324/76.12; 364/487
[58] Field of Search ................. 324/76.12, 76.13, 324/76.52, 76.54, 76.77, 86; 364/487

[56] References Cited

U.S. PATENT DOCUMENTS

| | | | |
|---|---|---|---|
| 3,395,346 | 7/1968 | Kincheloe et al. | 324/76.52 X |
| 3,895,294 | 7/1975 | Vinding | 324/76.52 |
| 4,675,614 | 6/1987 | Gehrke | 324/76.77 X |
| 4,890,056 | 12/1989 | Peters et al. | 324/76.82 |
| 4,983,906 | 1/1991 | Hiller | 324/76.12 |
| 5,053,714 | 10/1991 | Durand | 324/613 |
| 5,189,420 | 2/1993 | Eddy et al. | 324/76.52 X |
| 5,361,312 | 11/1994 | Kuchel | 324/76.77 X |

FOREIGN PATENT DOCUMENTS

| | | |
|---|---|---|
| 2258383 | 6/1973 | Germany . |
| 2308833 | 12/1974 | Germany . |
| 2536160 | 12/1976 | Germany . |
| 2837244 | 3/1979 | Germany . |
| 17279 | 4/1986 | Germany . |
| 4205300 | 7/1993 | Germany . |
| 1-143968 | 6/1989 | Japan . |

*Primary Examiner*—Glenn W. Brown
*Attorney, Agent, or Firm*—Wolf, Greenfield & Sacks, P.C.

[57] ABSTRACT

An apparatus for detecting the amplitude and phase of an a.c. signal detects the a.c. signal with signal detection means (4), calculates an a.c. signal that is phase-shifted by the amount of the phase characteristic $\phi$ of the calculation circuit (14) at the frequency of the detected a.c. signal, multiplies the detected a.c. signal by cos $\phi$, and multiplies by 1/sin $\phi$ the multiplication result subtracted by the phase-shifted a.c. signal.

6 Claims, 23 Drawing Sheets

APPARATUS FOR DETECTING THE AMPLITUDE AND PHASE OF AN A.C. SIGNAL

This application is a division of application Ser. No. 08/331,366, filed Oct. 27, 1994, entitled APPARATUS FOR DETECTING THE AMPLITUDE AND PHASE OF AN A.C. SIGNAL now U.S. Pat. No. 5,498,955.

BACKGROUND OF THE INVENTION

1. Field of the Invention

The present invention relates to an apparatus for detecting the amplitude and phase of an a.c. signal (a.c. voltage or current) that is used for the control or protection of electrical devices, e.g., circuit breaker, power converter or power regulator, connected to a power system.

2. Description of the Prior Art

FIG. 23 shows the arrangement of a conventional amplitude and phase detecting apparatus. Reference numeral 1 denotes an object system for which the amplitude and phase of an a.c. signal are detected, 2 is a single-phase a.c. power source having a voltage amplitude of Vo and angular frequency of $\omega_0$, 3 is a load connected to the a.c. power source, and 4 is an a.c. voltage detector (a.c. voltage detection means) which detects the a.c. voltage (a.c. signal) of the object system 1 and produces a voltage signal v that is proportional to the a.c. voltage. The apparatus may be designed to detect the a.c. current instead of the a.c. voltage.

Indicated by 5 is an amplitude detector which detects the amplitude V of the a.c. voltage v, and this device is disclosed in Japanese Patent Publication No. 56-28469. Indicated by 6 is a phase detector which detects the phase θ of the a.c. voltage v, and this device is disclosed in the Electric Engineering Handbook, p. 447, published in February 1988 by The Institute of Electrical Engineers of Japan.

Indicated by 7 is a rectifying circuit which implements the single-phase full-wave rectification for the voltage signal v provided by the a.c. voltage detector. 8 is a first-order lag circuit for attenuating the even harmonics of the voltage signal v thereby to produce a signal that is proportional to the amplitude of the voltage signal v, 9 is a zero-cross point detection circuit for detecting the zero-cross point of the voltage signal v, and 10 is a phase comparison circuit which detects the phase difference between the detected zero-cross point and the output phase of a voltage-controlled oscillator (VCO) 12 which oscillates so that the phase difference provided through a low-pass filter 11 is minimum at which the output phase represents the phase θ of the voltage signal v.

Low pass filter 11 is used to remove higher harmonics included in a phase difference signal detected by phase comparison circuit 10.

In operation, the a.c. voltage detector 4 detects the a.c. voltage of the object system 1 and produces a voltage signal v that is proportional to the a.c. voltage. The voltage signal v is fed to the amplitude detector 5 and phase detector 6, by which the amplitude V and phase θ of the a.c. voltage are detected.

In the amplitude detector 5, the rectifying circuit 7 implements the single-phase full-wave rectification for the voltage signal v to produce a signal, which includes even harmonics of the voltage signal v in addition to a d.c. component. The first-order lag circuit 8 filters out the even harmonics, thereby to detect the d.c. component that represents the amplitude V of the voltage signal v.

In the phase detector 6, the zero-cross point detection circuit 9 detects the zero-cross point of the voltage signal v, and the phase comparison circuit 10 detects the phase difference between the zero-cross point and the output phase of the voltage-controlled oscillator 12 which oscillates so that the phase difference is minimum at which the output phase represents the phase θ of the voltage signal v. Harmonic components included in the phase difference signal provided by the phase comparison circuit 10 are eliminated by the low-pass filter 11 so that phase θ of the a.c. voltage is detected accurately.

This circuit arrangement, however, includes a first-order lag circuit 8 in the amplitude detector 5 and a low-pass filter 11 in the phase detector 6, and these circuits cause a time lag because of their characteristics in detecting the amplitude V and phase θ of the a.c. voltage.

Another conventional amplitude and phase detection apparatus disclosed in Japanese Patent Laid-open No. 1-301183 uses an observer to split a detected a.c. signal into two a.c. signals that are out of phase with each other by 90° and calculates the amplitude of the a.c. signal based on the split a.c. signals. However, the observer generally has a delay of response, causing a phase lag in its output, and therefore this apparatus either cannot detect the amplitude V of an a.c. voltage instantaneously.

The conventional a.c. signal amplitude and phase detection apparatus arranged as described above is not capable of detecting the amplitude and phase of an a.c. signal instantaneously due to the use of the first-order lag circuit 8 and low-pass filter 11 that cause a phase lag because of their phase characteristics, and consequently it cannot perform perfectly the control or protection of electrical devices in the system.

SUMMARY OF THE INVENTION

The present invention is intended to overcome the foregoing deficiencies.

A first object of this invention is to provide an amplitude and phase detection apparatus capable of detecting the amplitude and phase of an a.c. signal without a phase lag.

A second object of this invention is to provide an amplitude and phase detection apparatus capable of detecting the amplitude and phase of an a.c. signal accurately even if the signal frequency of the object system varies.

A third object of this invention is to provide an a.c. signal amplitude and phase detection apparatus which is immune to noise.

A fourth object of this invention is to provide an a.c. signal amplitude and phase detection apparatus which is immune to harmonics included in the signal.

In order to achieve the above objectives, the a.c. signal amplitude and phase detection apparatus based on this invention includes a calculation circuit which has a certain phase characteristic at the frequency of the a.c. signal detected by an a.c. signal detection means and calculates an a.c. signal having its phase shifted by the amount of the phase characteristic, a first amplifying circuit which multiplies the cosine of the phase characteristic to the detected a.c. signal, and a second amplifying circuit which multiplies the reciprocal of the sine of the phase characteristic to the output of the first amplifying circuit subtracted by the output of the calculation circuit. The calculation instantaneously yields two a.c. signals that have the frequency of the detected a.c. signal and are out of phase with each other by 90°, and consequently the amplitude and phase of the a.c. signal can be detected without a phase lag.

The inventive a.c. signal amplitude and phase detection apparatus includes a compensation means which calculates the gain characteristic and phase characteristic of the calculation circuit based on the frequency calculated with a frequency calculation means, multiplies the reciprocal of the gain characteristic to the output of the calculation circuit, and provides the cosine of the phase characteristic and the reciprocal of the sine of the phase characteristic as multiplication factors for the first and second amplifying circuits, respectively. Consequently, it is possible to detect the amplitude and phase of the a.c. signal accurately even if the signal frequency of the object system varies.

The inventive a.c. signal amplitude and phase detection apparatus includes a compensation means which calculates the gain characteristic and phase characteristic of the calculation circuit based on the frequency command value, multiplies the reciprocal of the gain characteristic to the output of the calculation circuit, and provides the cosine of the phase characteristic and the reciprocal of the sine of the phase characteristic as multiplication factors for the first and second amplifying circuits, respectively. Consequently, it is possible to detect the amplitude and phase of the a.c. signal accurately even if the signal frequency of the object system varies due to its variable-frequency power source.

Moreover, the inventive a.c. signal amplitude and phase detection apparatus includes a compensation signal generator which advances the phase of the detected a.c. signal by the amount of the phase characteristic of the first-order lag circuit in use. Consequently, the phase lag attributable to the first-order lag circuit is eliminated, and it becomes possible to detect the amplitude and phase of the a.c. signal accurately without a phase lag.

Moreover, the inventive a.c. signal amplitude and phase detection apparatus includes a compensation signal generator which advances the phase of the detected a.c. signal by the amount of the phase characteristic of the low-pass filter in use. Consequently, the phase lag attributable to the low-pass filter is eliminated, and it becomes possible to detect the amplitude and phase of the a.c. signal accurately without a phase lag.

Moreover, the inventive a.c. signal amplitude and phase detection apparatus includes a rotational transformation circuit which implements the rotational transformation for the outputs of the first and second amplifying circuits depending on the phase characteristic of the first-order lag circuit thereby to advance the phase of these outputs by the amount of the phase characteristic. Consequently, the phase lag attributable to the first-order lag circuit is eliminated, and it becomes possible to detect the amplitude and phase of the a.c. signal accurately without a phase lag.

Moreover, the inventive a.c. signal amplitude and phase detection apparatus includes a compensation means which calculates the gain characteristic of the circuit section from the input of the first-order lag circuit up to the output of the subtracter and the gain characteristic and phase characteristic of the first-order lag circuit based on the frequency calculated by the frequency calculation means, multiplies the reciprocal of the gain characteristic of the circuit section to the output of the first-order lag circuit, and multiplies the reciprocal of the gain characteristic of the first-order lag circuit to the output of the subtracter, and provides the phase characteristic of the first-order lag circuit to the rotational transformation circuit. Consequently, it becomes possible to detect the amplitude and phase of the a.c. signal accurately even if the signal frequency of the object system varies.

Moreover, the inventive a.c. signal amplitude and phase detection apparatus includes a compensation means which calculates the gain characteristic of the circuit section from the input of the first-order lag circuit up to the output of the subtracter and the gain characteristic and phase characteristic of the first-order lag circuit based on the frequency command value, multiplies the reciprocal of the gain characteristic of the circuit section to the output of the first-order lag circuit, multiplies the reciprocal of the gain characteristic of the first-order lag circuit to the output of the subtracter, and provides the phase characteristic of the first-order lag circuit to the rotational transformation circuit. Consequently, it becomes possible to detect the amplitude and phase of the a.c. signal accurately even if the signal frequency of the object system varies due to its variable-frequency power source.

Moreover, the inventive a.c. signal amplitude and phase detection apparatus includes a rotational transformation circuit which implements the rotational transformation for the outputs of the low-pass filter and differentiation circuit depending on the phase characteristic of the low-pass filter and advances the phase of their outputs by the amount of the phase characteristic. Consequently, the phase lag attributable to the low-pass filter is eliminated, and it becomes possible to detect the amplitude and phase of the a.c. signal accurately without a phase lag.

Moreover, the inventive a.c. signal amplitude and phase detection apparatus includes a conversion means which implements the rotational transformation for the outputs of the a.c. signal detection means and differentiation circuit based on the reference phase for the a.c. signal and converts these outputs into a cosine wave component and sine wave component of the a.c. signal. Consequently, the cosine and sine wave components of the a.c. signal are calculated instantaneously, and it becomes possible to detect the amplitude and phase of the a.c. signal without a phase lag.

Moreover, the inventive a.c. signal amplitude and phase detection apparatus includes a conversion means which implements the rotational transformation for the outputs of the first-order lag circuit and first-order lead circuit based on the reference phase for the a.c. signal and converts these outputs into a cosine wave component and sine wave component of the a.c. signal. Consequently, the phase lag attributable to the first-order lag circuit is eliminated, and it becomes possible to detect the amplitude and phase of the a.c. signal instantaneously without using a differentiation circuit.

Moreover, the inventive a.c. signal amplitude and phase detection apparatus includes a phase difference generation means which subtracts the output of the first-order lag circuit from the a.c. signal detected by the a.c. signal detection means and multiplies certain values to the subtraction result and the a.c. signal, and a conversion means which implements the rotational transformation for the output of the phase difference generation means based on the reference phase for the a.c. signal and converts the output into a cosine wave component and sine wave component of the a.c. signal. Consequently, the phase lag attributable to the first-order lag circuit is eliminated, and it becomes possible to detect the amplitude and phase of the a.c. signal instantaneously without using a differentiation circuit.

Moreover, the inventive a.c. signal amplitude and phase detection apparatus includes a conversion means which implements the rotational transformation for the outputs of the a.c. signal detection means and phase-lead circuit based on the reference phase of the a.c. signal and converts these outputs into a cosine wave component and sine wave component of the a.c. signal. Consequently, it becomes possible to detect the amplitude and phase of the a.c. signal instantaneously without using a differentiation circuit.

Moreover, the inventive a.c. signal amplitude and phase detection apparatus includes a conversion means which multiplies the a.c. signal detected by the a.c. signal detection means to the cosine and sine components of the a.c. signal having the reference phase, provides the results of multiplication for the first-order lag circuit, and calculates the cosine and sine components of the a.c. signal based on the multiplication results subtracted by the output of the first-order lag circuit and on the output of the first-order lag circuit. Consequently, the phase lag attributable to the first-order lag circuit is eliminated, and it becomes possible to detect the amplitude and phase of the a.c. signal instantaneously without using a differentiation circuit.

Moreover, the inventive a.c. signal amplitude and phase detection apparatus is designed to deliver the cosine and sine wave components of the a.c. signal provided by the conversion means to an amplitude-phase difference detection means after they have been fed through a low-pass filter. Consequently, it becomes possible for the apparatus to be immune to harmonics included in the a.c. signal.

DESCRIPTION OF THE PREFERRED EMBODIMENTS

Preferred embodiments of this invention will be explained in detail with reference to the drawings.
Embodiment 1

Figure 1:
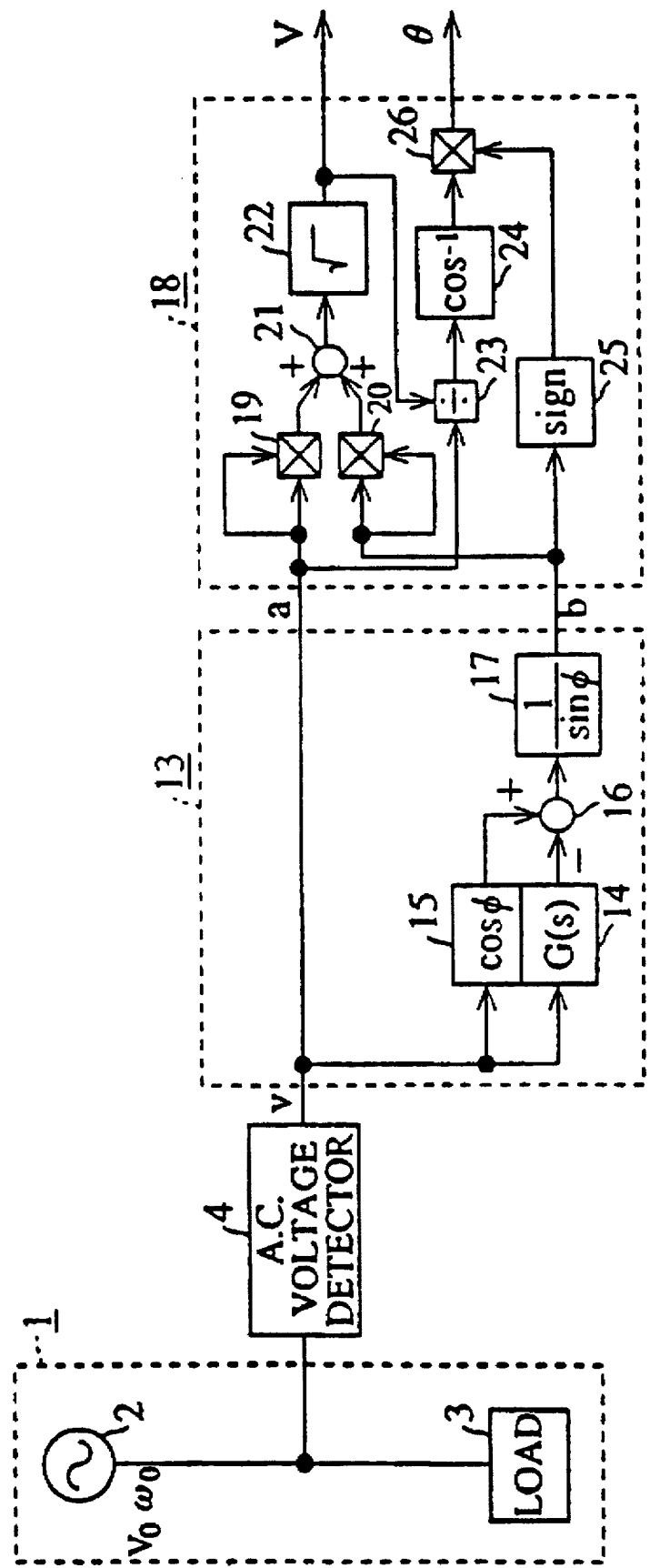
FIG. 1 is a block diagram of the a.c. signal amplitude and phase detection apparatus based on an embodiment of this invention.
Figure 23:
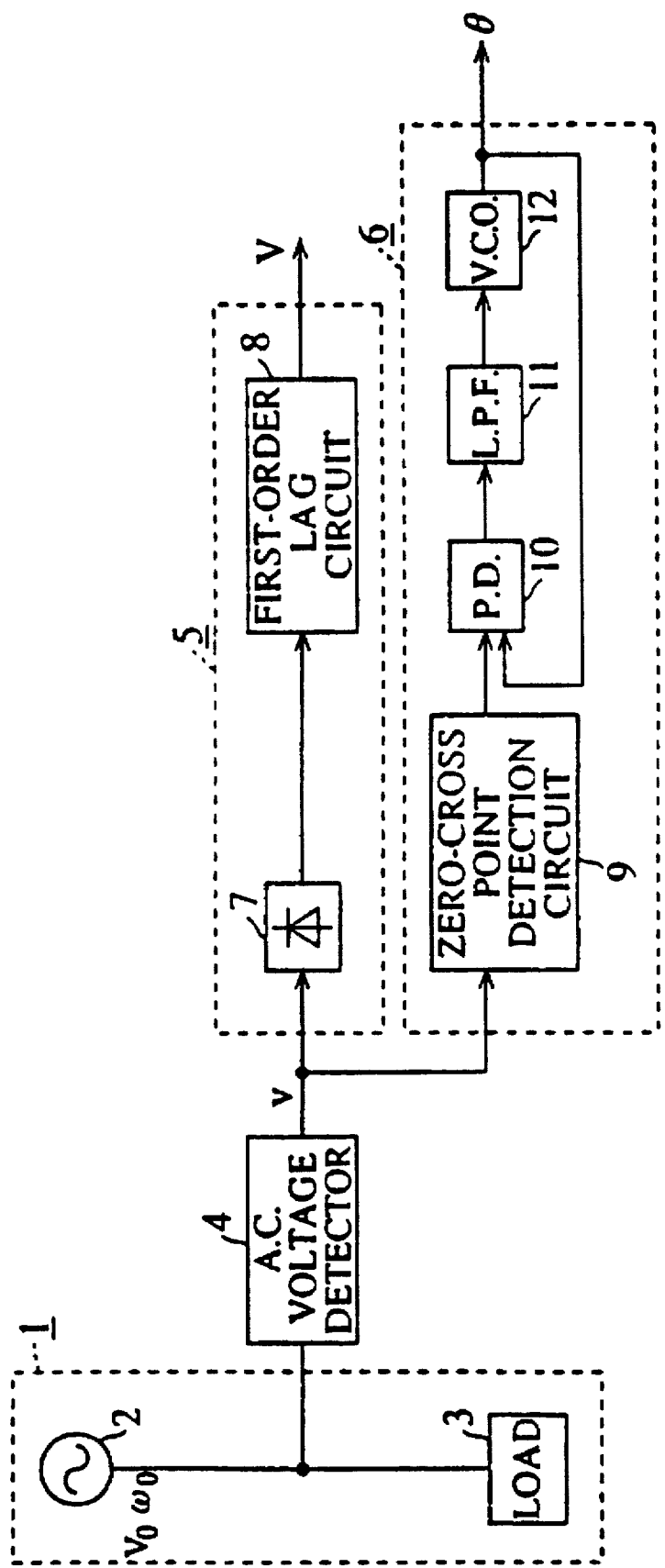
FIG. 23 is a block diagram showing the conventional a.c. signal amplitude and phase detection apparatus.

FIG. 1 shows the arrangement of the a.c. signal amplitude and phase detection apparatus based on the first embodiment of this invention, in which items identical to those of the conventional apparatus shown in FIG. 23 are referred to by the same symbols and explanation thereof will not be repeated.

Reference numeral 13 denotes a signal split means which splits the voltage signal (a.c. voltage) v detected by the a.c. voltage detector 4 (a.c. voltage detection means) into two voltage signals a and b that have the frequency of the signal v and are out of phase with each other by 90°. 14 is a calculation circuit which has a certain phase characteristic $\phi$ (and a gain characteristic is unity, i.e., 0 dB) at the frequency of the detected voltage signal v and calculates a voltage signal having its phase shifted by the amount of the phase characteristic $\phi$. 15 is an amplifier (first amplifying circuit) which multiplies the detected voltage signal v by cos $\phi$. 16 is a subtracter which subtracts the output of the calculation circuit 14 from the output of the amplifier 15, and 17 is an amplifier which multiplies the output of the subtracter 16 by the reciprocal of sin $\phi$. The subtracter 16 and amplifier 17 in combination constitute a second amplifying circuit.

indicated by 18 is an amplitude/phase detection means which implements the polar coordinate transformation for the split signals a and b thereby to detect the amplitude V and phase $\theta$ of the voltage signal v, 19 is a multiplier which squares the voltage signal a, 20 is a multiplier which squares the voltage signal b, 21 is an adder which sums the outputs of the multipliers 19 and 20, 22 is a square root calculation circuit which calculates the square root of the output of the adder 21, 23 is a divider which divides the voltage signal a by the output of the square root calculation circuit 22, 24 is an inverse-cosine calculation circuit which calculates the inverse cosine (in the range of 0°–180°) of the output of the divider 23, 25 is a polarity calculation circuit which produces "1" in response to a positive voltage signal b or "–1" for a negative voltage signal b, and 26 is a multiplier which multiplies the output of the polarity calculation circuit 25 to the output of the inverse-cosine calculation circuit 24 thereby to evaluate the phase $\phi$ of the voltage signal v within the range of –180° to 180°.

The a.c. voltage detector 4 detects the a.c. voltage of the object system 1 and produces a voltage signal v that is proportional to the a.c. voltage in the same manner as the conventional apparatus. The signal split means 13 splits the received voltage signal v into two voltage signals a and b that have the frequency of the voltage signal v and are out of phase with each other by 90° as follows.

For a voltage signal v expressed as V cos $\theta$, it is used intactly as the voltage signal a, and the calculation circuit 14 calculates another voltage signal v having its phase shifted by the amount of the phase characteristic $\phi$ as follows.

Original voltage signal v:

$$v = V \cos \theta \quad (1)$$

Calculated voltage signal v:

$$\begin{aligned} v &= V \cos(\theta + \phi) \\ &= V(\cos \theta \cos \phi - \sin \theta \sin \phi) \end{aligned} \quad (2)$$

The amplifier 15 bases the operation on a multiplication factor of cos $\phi$, multiplying the voltage signal v by cos $\phi$ as follows.

$$\text{Output of amplifier } 15 = V \cos \theta \cos \phi \quad (3)$$

After the subtracter 16 has subtracted the output of the calculation circuit 14 from the output of the amplifier 15, the amplifier 17 multiplies the subtraction result by the reciprocal of sin $\phi$ to produce the voltage signal b as follows.

$$\text{Output of subtracter } 16 = V \sin \theta \sin \phi \quad (4)$$

$$\begin{aligned} b &= V \sin \theta \sin \phi / \sin \phi \\ &= V \sin \theta \end{aligned} \quad (5)$$

Accordingly, the signal split means 13 produces the voltage signals a=V cos $\theta$ and b=V sin $\theta$ that are derived from the original voltage signal v and are out of phase with each other by 90°. Since the signal split means 13 produces the voltage signals a and b based on the calculation, instead of using a first-order lag circuit and low-pass filter used in the conventional apparatus, the voltage signals a and b have no phase lag.

Figure 2:
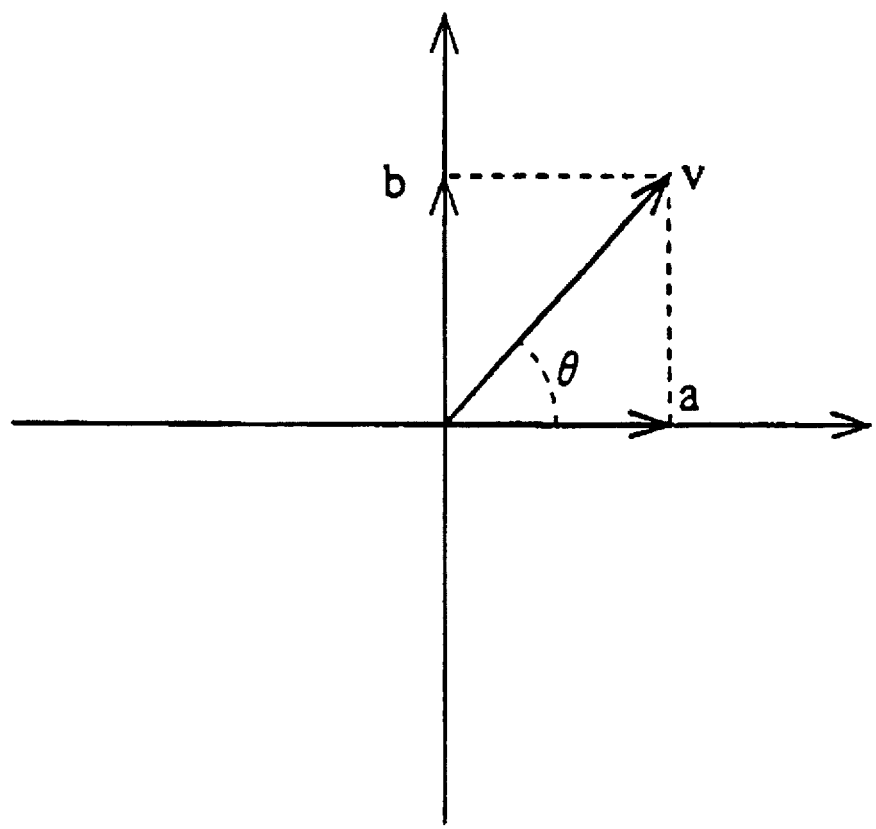
FIG. 2 is a diagram explaining the polar coordinate transformation.

Next, the amplitude/phase detection means 18 implements the polar coordinate transformation for the resulting voltage signals a and b to detect the amplitude V and phase $\theta$ of the voltage signal v as follows (also refer to FIG. 2).

The voltage signals a and b are squared by the respective multipliers 19 and 20, and the adder 21 sums the multiplier outputs as follows.

$$\text{Output of adder } 21 = V^2 \cos^2 \theta + V^2 \sin^2 \theta \quad (6)$$

The square root calculation circuit 22 calculates the square root of the output of the adder 21, and its output (magnitude of polar coordinates) represents the amplitude V of the a.c. signal as follows.

Output of square root calculation circuit $22=(V^2 \cos^2 \theta + V^2 \sin^2 \theta)^{1/2} = \{V^2 (\cos^2 \theta + \sin^2 \theta)\}^{1/2} = V$  (7)

The divider 23 divides the voltage signal a by the output of the square root calculation circuit 22, and the inverse-cosine calculation circuit 24 calculates the $\cos^{-1}$ of the output of the divider 23 as follows.

Output of divider $23 = V \cos \theta / V = \cos \theta$  (8)

Output of inverse-cosine calculation circuit $24 = \theta$  (9)

where $0 < \theta < 180°$.

Finally, the multiplier 26 multiplies the output of the inverse cosine calculation circuit 24 by the output of the polarity calculation circuit 25 (it is "1" for a positive voltage signal b, or "−1" for a negative voltage signal b), and the multiplier output represents the phase θ of the a.c. voltage within the range of −180° to 180°.

This embodiment can evaluate the two voltage signals a and b of 90° phase difference through the calculation, and the amplitude V and phase θ of the a.c. voltage can be detected without a phase lag. Consequently, the electrical device in the object system can have the enhanced control or protection performance based on the detected amplitude and phase of the a.c. voltage.

Embodiment 2

This embodiment, which is derived from Embodiment 1, uses an a.c. current detector to detect the a.c. current of the object system 1 for producing the a.c. signal, in contrast to Embodiment 1 where the a.c. voltage detector 4 is used, and the same effectiveness as of Embodiment 1 is achieved.

Embodiment 3

This embodiment, which is derived from Embodiment 1, uses an inverse-sine calculation circuit or inverse-tangent calculation circuit to calculate the phase θ, in contrast to Embodiment 1 where the inverse-cosine calculation circuit is used.

Embodiment 4

Figure 3:
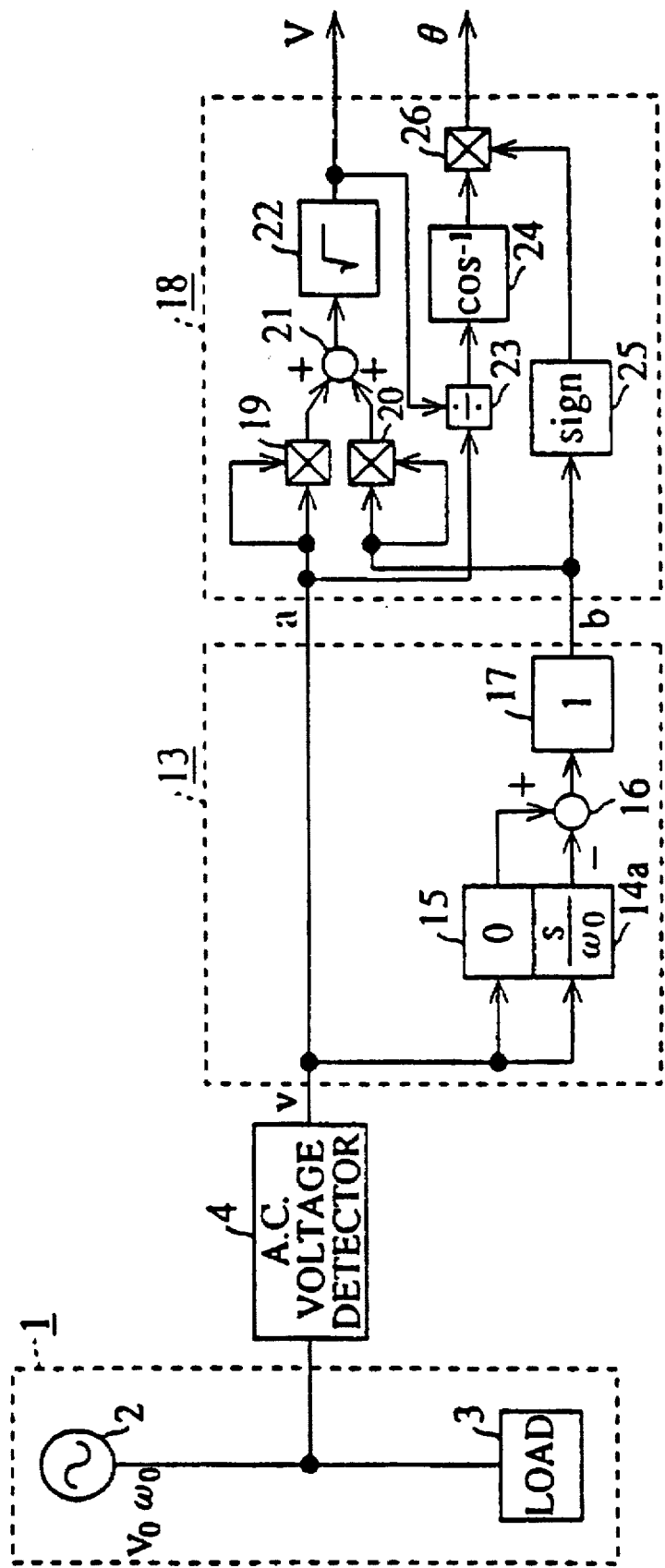
FIG. 3 through FIG. 22 are block diagrams showing the a.c. signal amplitude and phase detection apparatus based on other embodiments of this invention.

FIG. 3 shows the arrangement of the amplitude and phase detection apparatus of this embodiment, in which the calculation circuit 14 of Embodiment 1 consists of a differentiation circuit 14a which differentiates the voltage signal v that is detected by the a.c. voltage detector 4. For the voltage signal v=V cos θ, the differentiation circuit 14a produces the output as follows.

Output of differentiation circuit $14a = -V \sin \theta$  (10)

The differentiation circuit 14a has a phase characteristic of 90°, since its output is out of phase with respect to the voltage signal v by 90°, and the amplifier 15 has a multiplication factor that is the cosine of the phase characteristic of the differentiation circuit 14a, i.e., cos 90°=0, and thus its gain is zero. The amplifier 17 has a multiplication factor that is the reciprocal of the sine of the phase characteristic of the differentiation circuit 14a, i.e., 1/sin 90°=1, and thus its gain is unity.

The subtracter 16 subtracts −V sin θ provided by the differentiation circuit 14a from zero (the amplifier 15 having a zero gain always produces a zero output), producing an output of V sin θ, and the amplifier 17 having a unity gain produces V sin θ as the voltage signal b. Accordingly, this embodiment calculates the phase without a phase lag as in Embodiment 1. The amplifier 15 with "0" gain has no effect and it can be eliminated.

Embodiment 5

Figure 4:
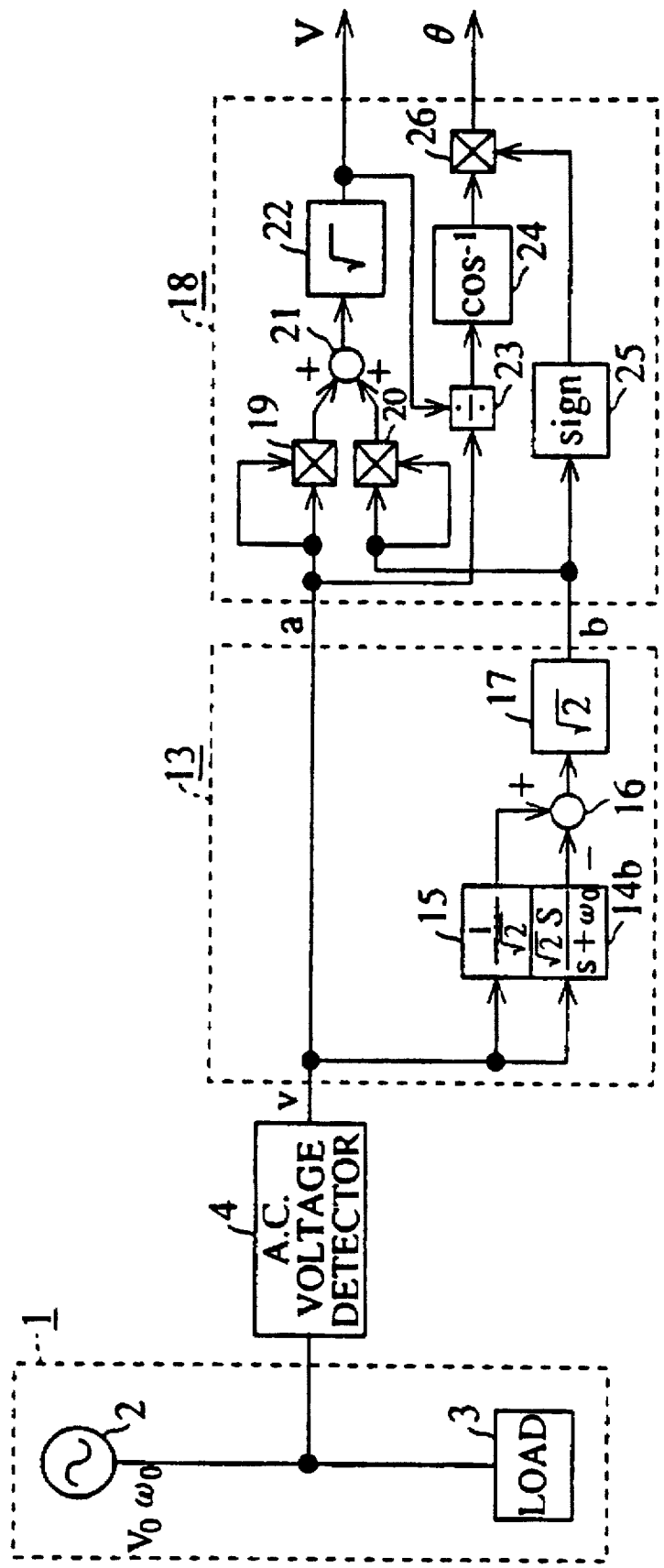

This embodiment, which is derived from Embodiment 1, employs a calculation circuit 14b that is expressed in the form of such a transfer function that it has a null point on the origin of the s-plane and a pole that is equal in magnitude to the angular frequency of the voltage signal v on the real axis in the left-hand of the plane, as shown in FIG. 4. In this case, the amplifiers 15 and 17 have gains of $\frac{1}{2}^{1/2}$ and $2^{1/2}$, respectively.

This embodiment does not need a differentiation circuit 14a used in Embodiment 4, and therefore it is more immune to noise.

Embodiment 6

Figure 5:
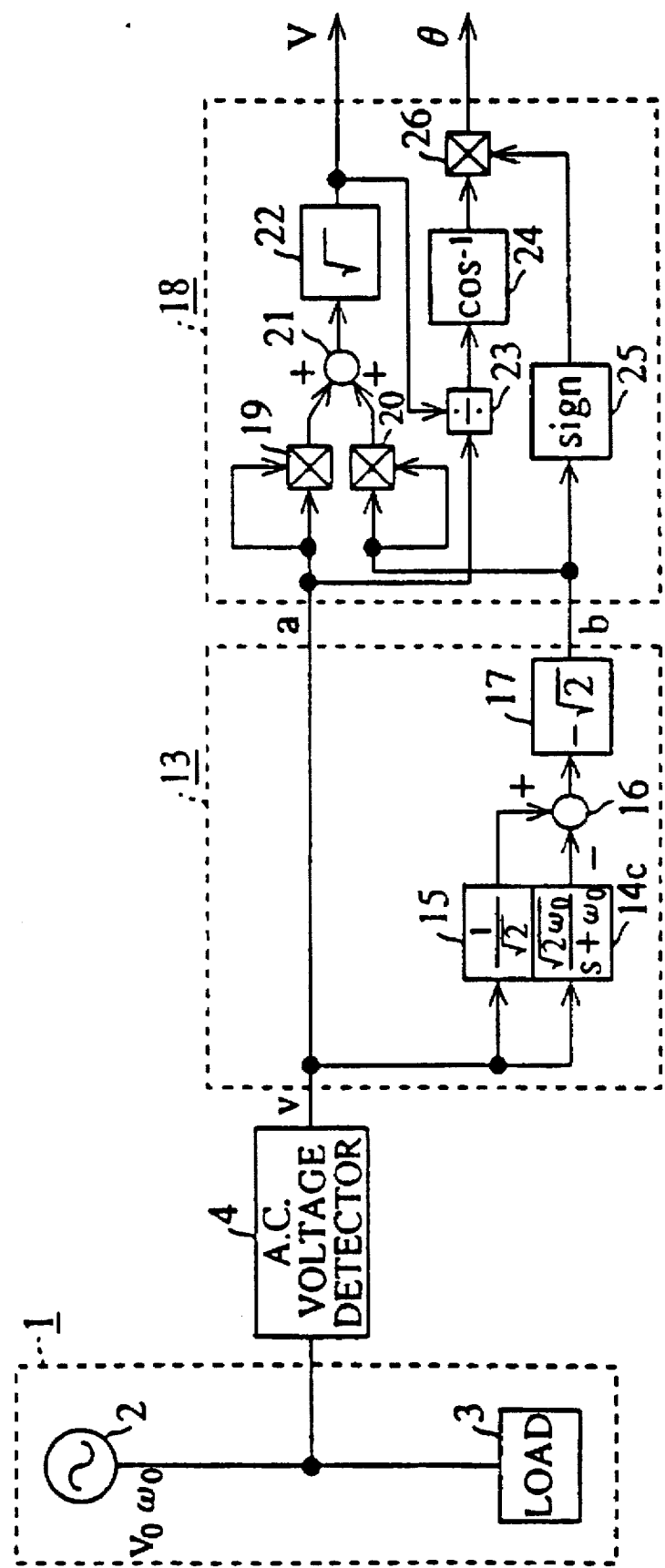

This embodiment, which is derived from Embodiment 1, employs a calculation circuit 14c that is expressed in the form of a transfer function of a stable first-order lag by having a pole that is equal in magnitude to the angular frequency of the voltage signal v, as shown in FIG. 5. In this case, the amplifiers 15 and 17 have gains of $\frac{1}{2}^{1/2}$ and $-2^{1/2}$, respectively. Being different from the first-order lag circuit 8 used in the conventional apparatus, the calculation circuit 14c carries out the first-order lag operation based on the calculation, and therefore it does not cause a phase lag.

This embodiment does not need a differentiation circuit 14a used in Embodiment 4, and therefore it is more immune to noise.

Embodiment 7

Figure 6:
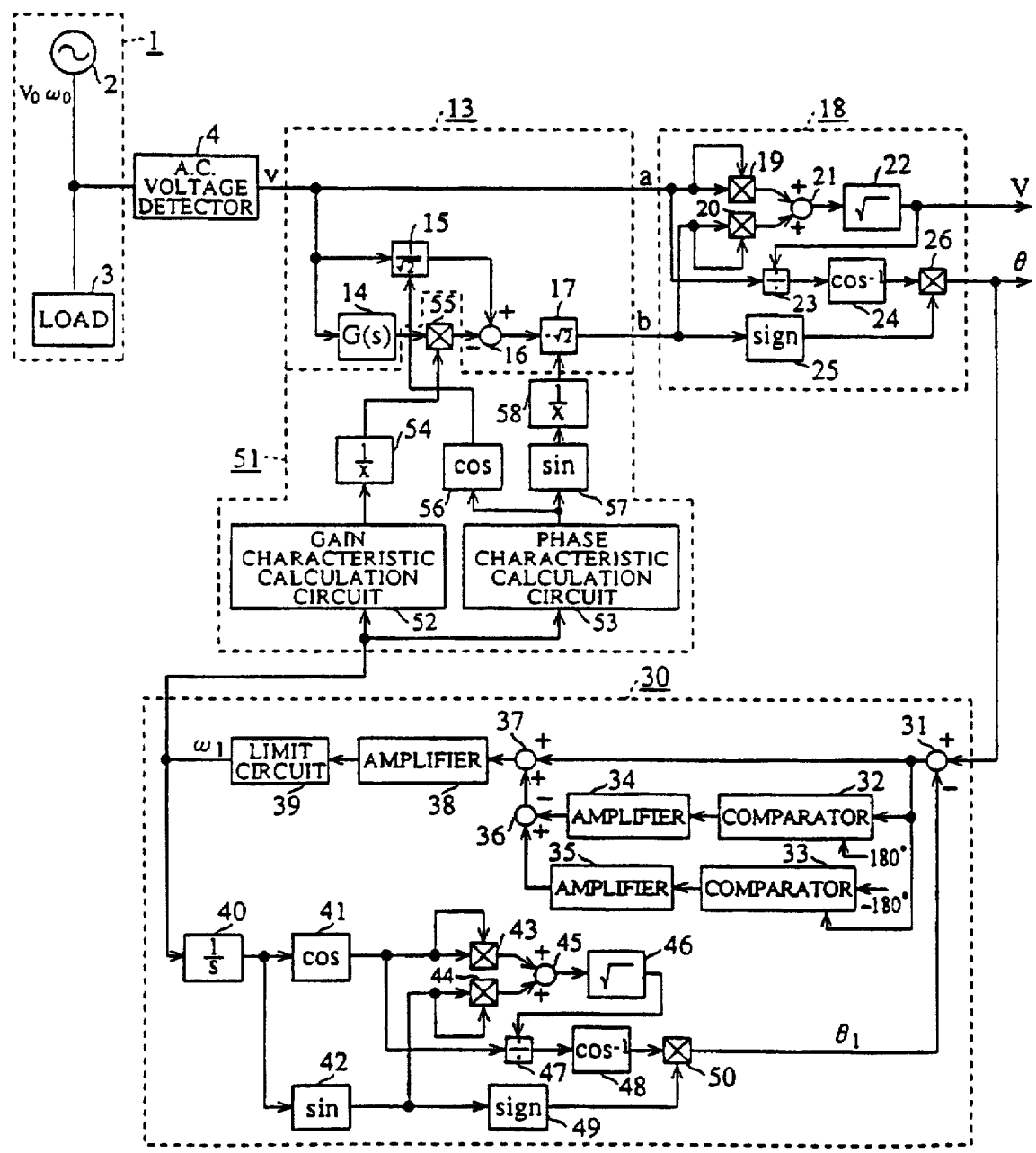

FIG. 6 shows the arrangement of the amplitude and phase detection apparatus of this embodiment (set forth in claim 3). In the figure, indicated by 30 is a frequency calculation means which calculates the frequency $\omega_1$ of the voltage signal v based on the phase θ detected by the amplitude/phase detection means 18, 31 is a subtracter which subtracts a calculated phase $\theta_1$ (will be explained later) from the phase θ detected by the amplitude/phase detection means 18, 32 is a comparator which produces "1" if the output of the subtracter 31 is greater than 180° or otherwise produces "0", 33 is a comparator which produces "1" if the output of the subtracter 31 is smaller than −180° or otherwise produces "0", 34 and 35 are amplifiers which amplify by 360 the outputs of the comparators 32 and 33, respectively, 36 is a subtracter which subtracts the output of the amplifier 34 from the output of the amplifier 35, 37 is an adder which sums the outputs of the subtracters 31 and 36, 38 is an amplifier which amplifies the output of the adder 37 to produce a signal indicative of the frequency $\omega_1$ of the voltage signal v, and 39 is a limit circuit which has an upper limit value and lower limit value that are set depending on the frequency variation of the voltage signal v and limits the calculated frequency $\omega_1$ within the range of limitation.

Indicated by 40 is an integration circuit which integrates the frequency $\omega_1$ provided by the limit circuit 39, 41 is a cosine calculation circuit which calculates the cosine of the output of the integration circuit 40, 42 is a sine calculation circuit which calculates the sine of the output of the integration circuit 40, 43 is a multiplier which squares the output of the cosine calculation circuit 41, 44 is a multiplier which squares the output of the sine calculation circuit 42, 45 is an adder which sums the outputs of the multipliers 43 and 44, 46 is a square root calculation circuit which calculates the square root of the output of the adder 45, 47 is a divider which divides the output of the cosine calculation circuit 41 by the output of the square root calculation circuit 46, 48 is an inverse-cosine calculation circuit which calculates the inverse cosine (in the range of 0°–180°) of the output of the the divider 47, 49 is a polarity calculation circuit which produces "1" in response to a positive output of the sine calculation circuit 42 or "−1" for a negative output, and 50 is a multiplier which multiplies the output of the inverse-cosine calculation circuit 48 by the output of the polarity calculation circuit 49 thereby to evaluate the phase φ of the voltage signal v within the range of −180° to 180°.

Indicated by 51 is a compensation means which calculates the gain characteristic and phase characteristic of the calculation circuit 14 based on the frequency $\omega_1$ calculated by the frequency calculation means 30, multiplies the output of the calculation circuit 14 by the reciprocal of the gain characteristic, and provides the cosine of the phase characteristic as a multiplication factor for the amplifier 15 and the reciprocal of the sine of the phase characteristic as a multiplication factor for the amplifier 17. Indicated by 52 is a gain characteristic calculation circuit which calculates the gain characteristic of the calculation circuit 14 based on the frequency el provided by the limit circuit 39. 53 is a phase characteristic calculation circuit which calculates the phase characteristic of the calculation circuit 14 based on the frequency $\omega_1$ provided by the limit circuit 39. 54 is a reciprocal calculation circuit which calculates the reciprocal of the gain characteristic. 55 is a multiplier which multiplies the reciprocal of the gain characteristic to the output of the calculation circuit 14. 56 is a cosine calculation circuit which calculates the cosine of the phase characteristic and provides it as a multiplication factor for the amplifier 15. 57 is a sine calculation circuit which calculates the sine of phase characteristic, and 58 is a reciprocal calculation circuit which calculates the reciprocal of the output of the sine calculation circuit 57 and provides it as a multiplication factor for the amplifier 17.

This embodiment, which is derived from Embodiment 1 and added by the frequency calculation means 30 and compensation means 51, is designed to calculate the amplitude V and phase θ of the voltage signal v accurately even if the frequency of the object system 1 varies.

The frequency calculation means 30 calculates the frequency $\omega_1$ of the voltage signal v so as to modify the transfer characteristics (gain characteristic and phase characteristic) of the calculation circuit 14 in response to the frequency variation of the object system so that the transfer characteristics always matches the system frequency, so that the amplitude V and phase θ of the voltage signal v can be detected accurately.

The subtracter 31 subtracts the calculated phase $\theta_1$ from the detected phase θ to evaluate the phase difference θ−$\theta_1$. The phase difference signal is fed to the adder 37 and also fed to the comparators 32 and 33, by which it is compared with 180° and −180°, and the subtracter 36 delivers 0, 360 or −360 to the adder 37 depending on the results of comparison. The adder 37 adds 0, 360 or −360 to the phase difference θ−$\theta_1$ so that it is confined in the range of −180 to 180 for the expedience of calculation, and consequently the closed loop system of the frequency calculation means 30 is stabilized.

The amplifier 38 amplifies the output of the adder 37, and the resulting frequency $\omega_1$ is limited between the upper and lower limits by the limit circuit 39. The limited frequency $\omega_1$ is delivered as the output of the frequency calculation means 30 to the compensation means 51. The limited frequency $\omega_1$ is also fed to the integration circuit 40, and the cosine calculation circuit 41 and sine calculation circuit 42 produce two signals that are out of phase with each other by 90° from the integration output with the intention of evaluating the phase $\theta_1$ in advance for the subsequent calculation of the frequency $\omega_1$ of the voltage signal v.

The calculation circuit section (multipliers 43 through 50) in the frequency calculation means 30 for calculating the phase $\theta_1$ based on the outputs of the cosine calculation circuit 41 and sine calculation circuit 42 is similar to the amplitude/phase detection means 18, and explanation thereof is omitted.

The gain characteristic and phase characteristic of the calculation circuit 14 calculated by the circuits 52 and 53 based on the frequency $\omega_1$ provided by the limit circuit 39 will be shown for the cases of transfer function G(s)=s and G(s)=√2/s+$\omega_0$ in the following.

For G(s)=s:
   Gain characteristic=ω
   Phase characteristic=π/2

For G(s)=√2·s/(s+$\omega_0$):
   Gain characteristic=√2·ω/($\omega^2$+$\omega_0^2$)$^{1/2}$
   Phase characteristic=π/2−tan$^{-1}$ω/($\omega_0$)

Subsequently, the reciprocating circuit 54 calculates the reciprocal of the gain characteristic, and the multiplier 55 multiplies the output of the calculation circuit 14 by the reciprocal of the gain characteristic. Accordingly, the calculation circuit 14 has its gain characteristic modified in response to the frequency variation of the object system 1.

The cosine calculation circuit 56 and sine calculation circuit 57 calculate the cosine and sine of the phase characteristic. The amplifier 15 has its multiplication factor set to be the cosine of phase characteristic, and accordingly it multiplies the cosine of phase characteristic to the voltage signal v. The reciplocating circuit 58 calculates the reciprocal of the sine of phase characteristic, and it is set for the multiplication factor of the amplifier 17. Accordingly, the amplifier 17 multiplies the output of the subtracter 16 by the reciprocal of the sine of phase characteristic, and consequently the calculation circuit 14 has its phase characteristic modified in response to the frequency variation of the object system 1.

This embodiment is capable of compensating the gain characteristic and phase characteristic of the calculation circuit 14 in response to the frequency variation of the object system 1, and the amplitude V and phase θ of the voltage signal v can be detected accurately even if the system frequency varies.

Embodiment 8

Figure 7:
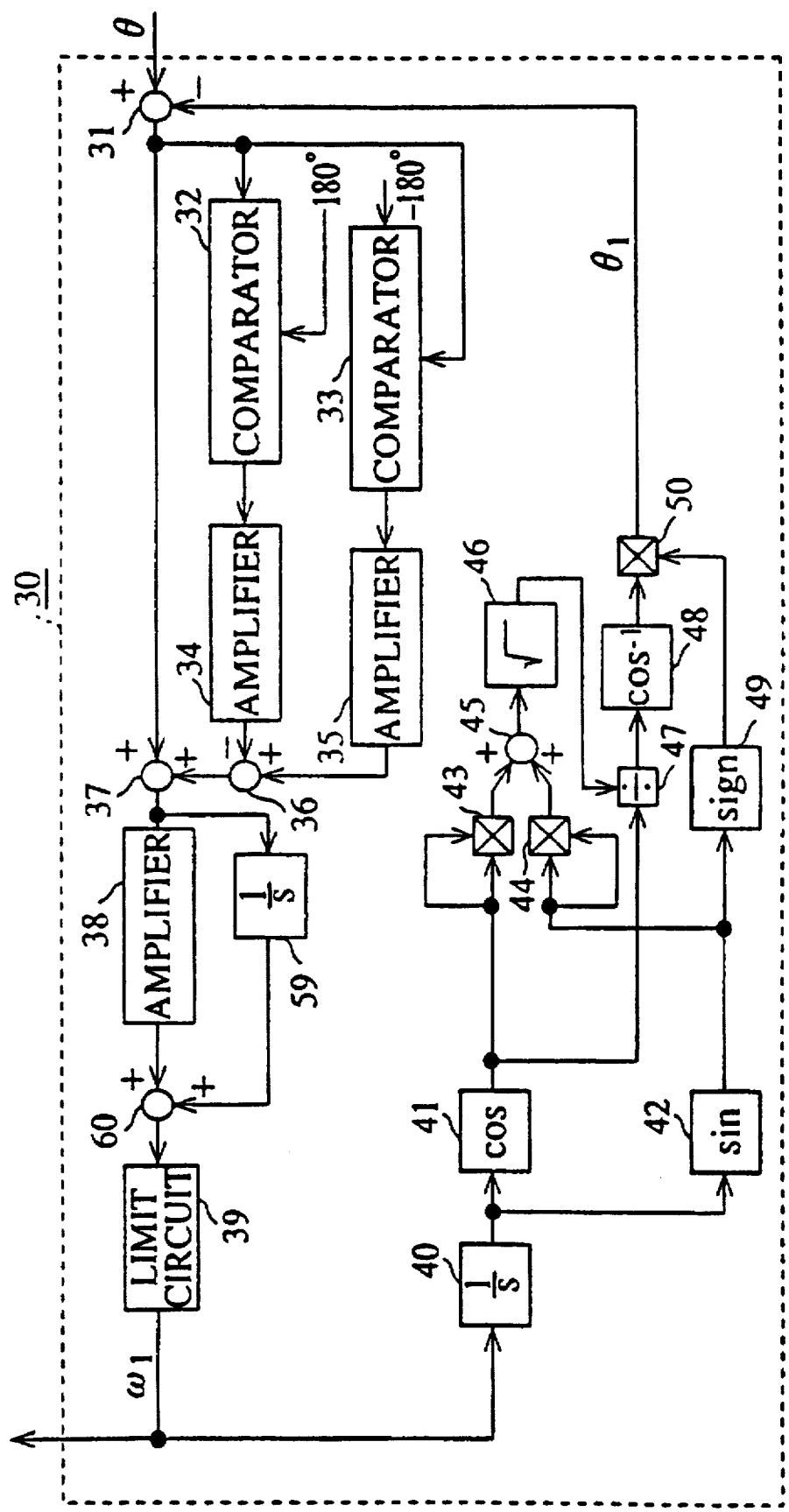

This embodiment, which is derived from Embodiment 7, includes an integration circuit 59 connected in parallel to the amplifier 38 for integrating the output of the adder 37, and an adder 60 which sums the outputs of the amplifier 38 and integration circuit 59 to evaluate the frequency $\omega_1$ of the voltage signal v, as shown in FIG. 7, in contrast to Embodiment 7 where the amplifier 38 amplifies the output of the adder 37 to evaluate the frequency $\omega_1$.

This embodiment can get rid of the offset error by use of the integration circuit 59, and therefore it can evaluate the frequency $\omega_1$ of the voltage signal v more accurately.

Embodiment 9

Figure 8:
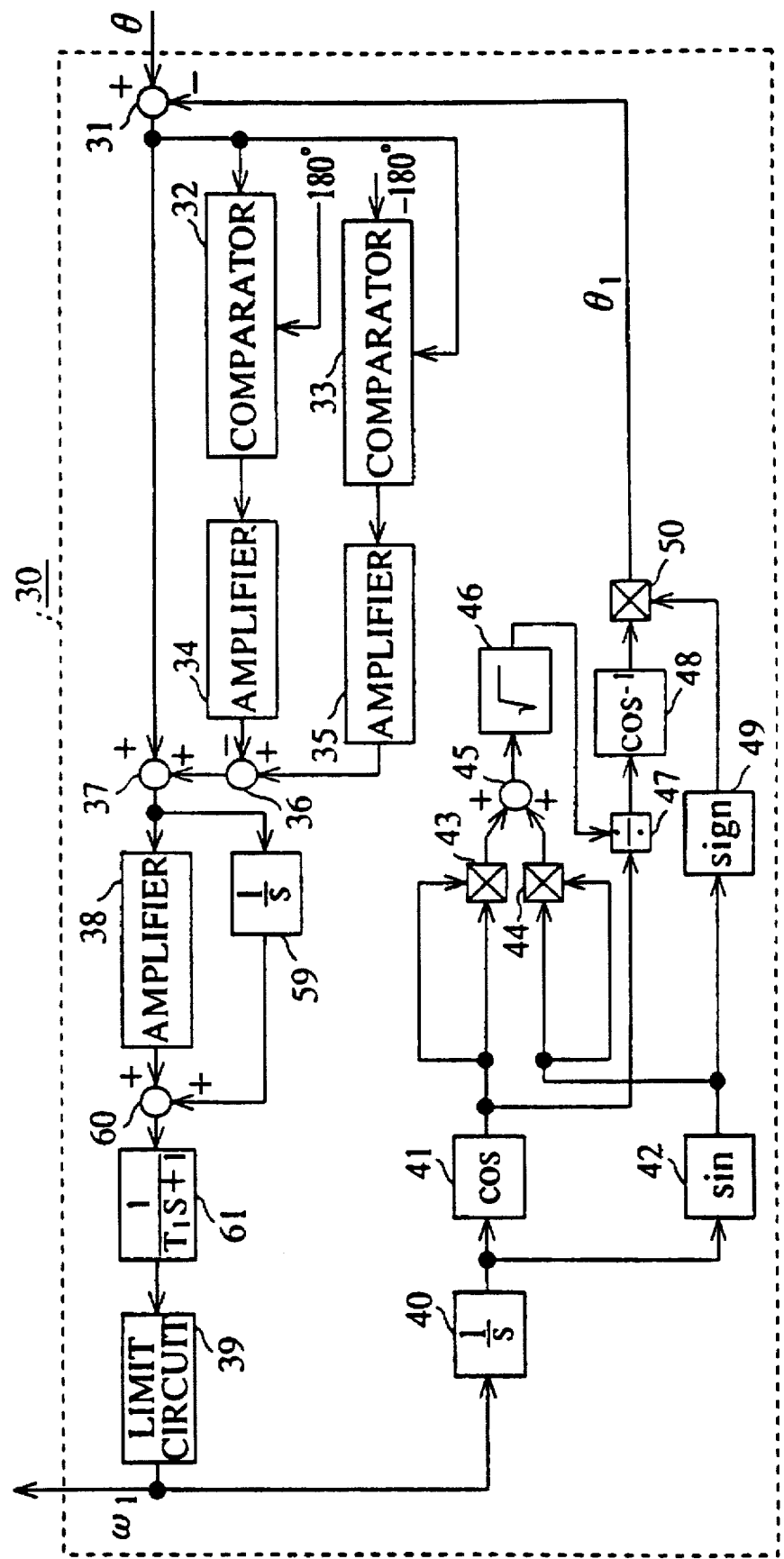

This embodiment, which is derived from Embodiment 8, includes a first-order lag circuit 61 at the output of the adder 60 as shown in FIG. 8, in contrast to Embodiment 8 where the adder 60 is connected directly to the limit circuit 39.

This embodiment is immune to noise and capable of evaluating the frequency $\omega_1$ of the voltage signal v more accurately.

Embodiment 10

Figure 9:
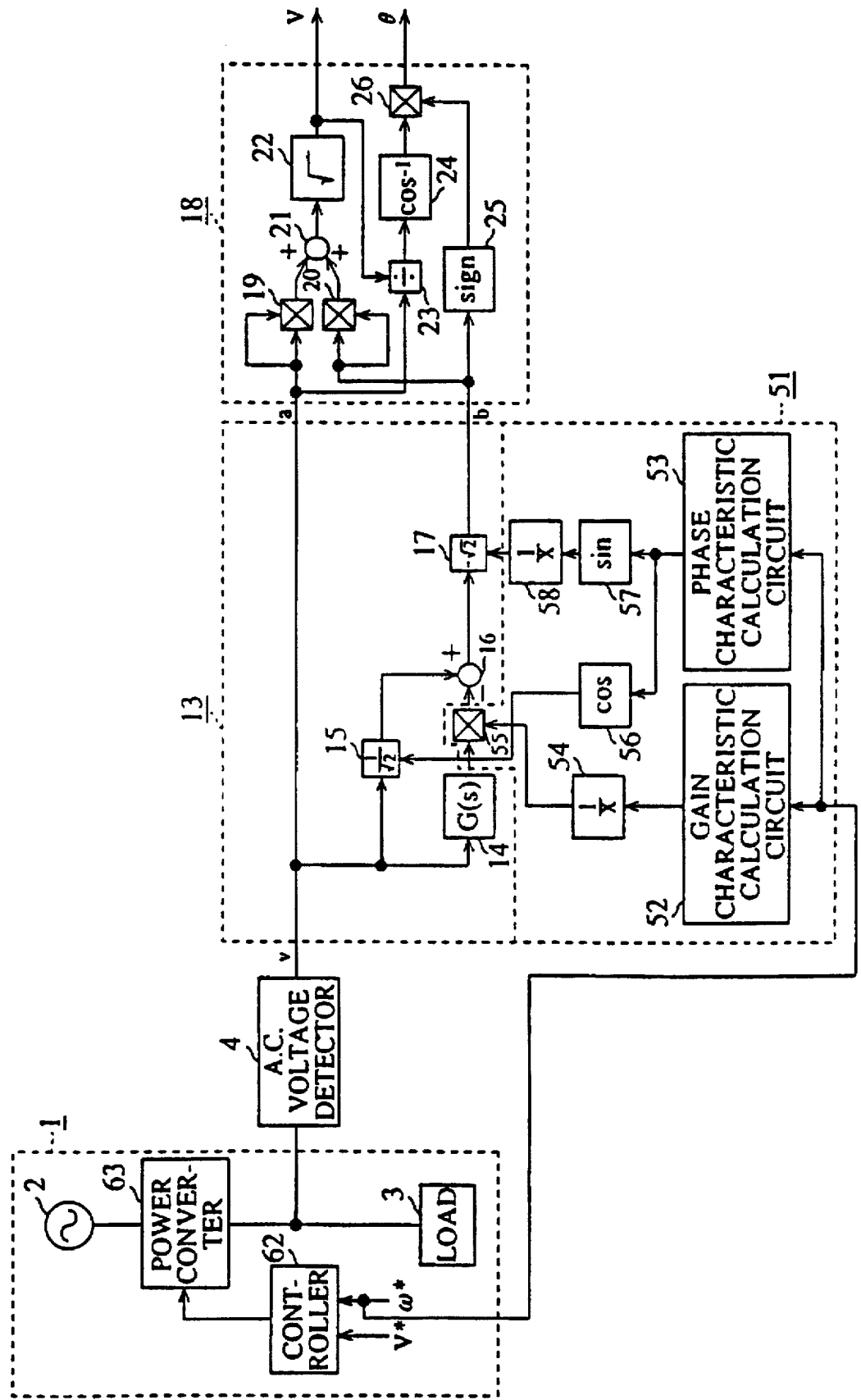

This embodiment is for the case of an object system 1 in which a controller 62 controls the system frequency in response to a frequency command value ω* and a power converter 63 supplies variable-frequency power to the load 3. The compensation means 51 compensates the gain characteristic and phase characteristic of the calculation circuit 14 based on the frequency command value ω*, as shown in FIG. 9, in contrast to Embodiment 7 where these characteristics of the calculation circuit 14 are compensated based on the evaluated frequency el of the object system 1. The remaining portion is identical to Embodiment 7, and the explanation thereof is omitted.

This embodiment is capable of detecting the amplitude V and phase θ of the voltage signal v accurately even for an object system which depends on a variable-frequency power source.

Embodiment 11

Figure 10:
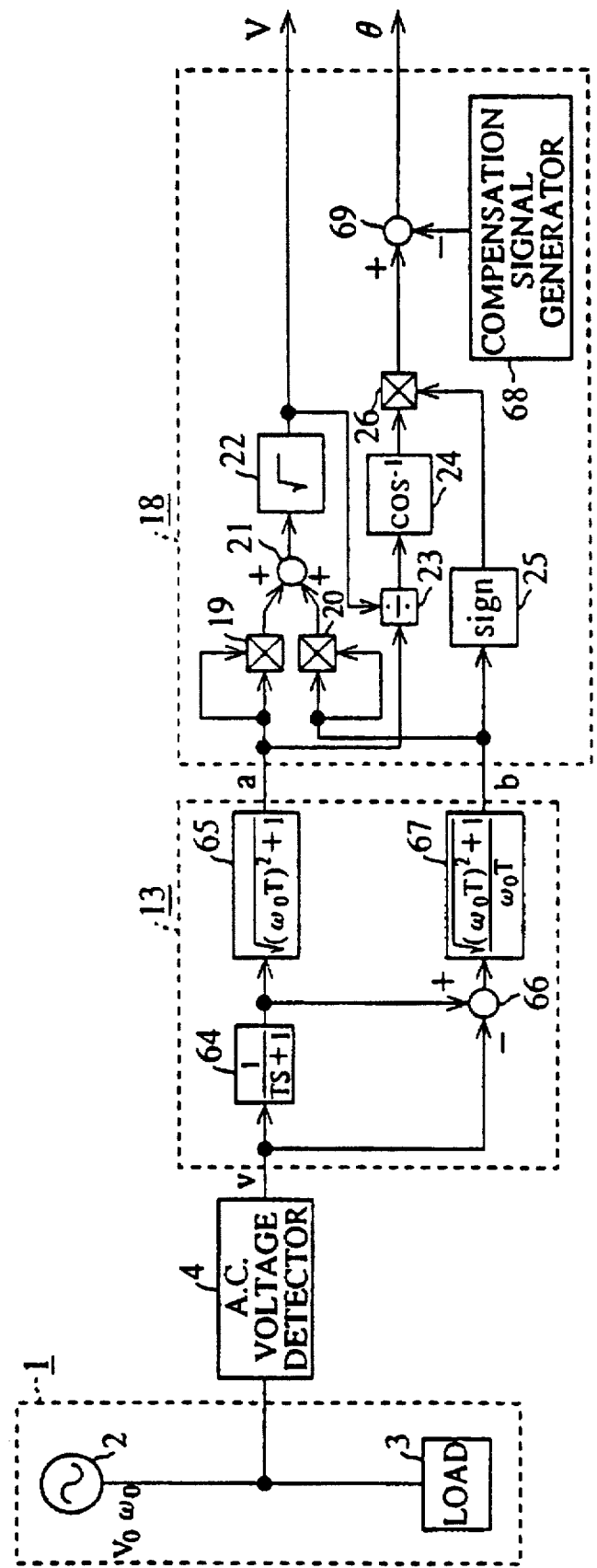

FIG. 10 shows the arrangement of the amplitude and phase detection apparatus based on this invention. In the figure, indicated by 64 is a first-order lag circuit which receives the voltage signal v from the a.c. voltage detector 4, 65 is an amplifier (first amplifying circuit) which multiplies the reciprocal of the gain of the first-order lag circuit 64 to the output of the circuit 64, 66 is a subtracter which subtracts the voltage signal v from the output of the first-order lag circuit 64, 67 is an amplifier (second amplifying circuit) which multiplies the reciprocal of the gain of the circuit section from the input of the first-order lag circuit 64 up to the output of the subtracter 66 to the output of the subtracter 66, 68 is a compensation signal generator which generates a compensation signal that advances the phase θ of the voltage signal v detected by the amplitude/phase detection means 18 by the amount of the phase characteristic of the first-order lag circuit 64, and 69 is a subtracter which subtracts the output of the compensation signal generator 68 from the output of the multiplier 26.

The first-order lag circuit 64 delays the phase of the voltage signal v by the amount of its phase characteristic φ.

The first-order lag circuit 64 has a transfer function of $G_1=1/(sT+1)$, i.e., it has a gain of $1/\{(\omega_0T)^2+1\}^{1/2}$, where T is the time constant. (d.c. gain is unity).

The voltage signal v delayed by the first-order lag circuit 64 is fed to the amplifier 65 having a multiplication factor set to the reciprocal of the gain of the circuit 64, i e., $\{(\omega_0T)^2+1\}^{1/2}$, which delivers the multiplication result as the voltage signal a.

The voltage signal v delayed by the first-order lag circuit 64 is also fed to the subtracter 66, by which the voltage signal v detected by the voltage detector 4 is subtracted from the delayed voltage signal v. The result of subtraction is fed to the amplifier 67 having a multiplication factor set to the reciprocal of the gain of the circuit section from the input of the first-order lag circuit 64 up to the output of the subtracter 66, i.e., $\{(\omega_0T)^2+1\}^{1/2}/\omega_0T$, which delivers the multiplication result as the voltage signal b.

The voltage signals a and b are conceived to be out of phase with each other by 90°, which is based on the comparison between the transfer function $G_1$ of the first-order lag circuit 64 and the transfer function $G_2$ of the circuit section from the input of the circuit 64 up to the output of the subtracter 66 as follows.

$$G_1 = 1/(sT + 1) \qquad (11)$$

$$\begin{aligned}G_2 &= 1 - 1/(sT+1) \\ &= -Ts/(sT+1)\end{aligned} \qquad (12)$$

Accordingly, for the voltage signal v=V cos θ, voltage signals a and b are expressed as follows.

$$a=V\cos(\theta-\phi) \qquad (13)$$

$$b=-V\sin(\theta-\phi) \qquad (14)$$

The amplitude/phase detection means 18 operates to detect the amplitude V and phase θ of the voltage signal v based on the voltage signals a and b as in Embodiment 1. However, in the present embodiment, the signal split means 13 uses the first-order lag circuit 64 having a phase lag of the amount of the phase characteristic φ, as shown by the formulas (13) and (14), and therefore the amplitude V and phase θ of the voltage signal v cannot be detected without a delay, i.e., the multiplier 26 produces an output phase of θ—φ.

This embodiment is designed to offset the above-mentioned phase lag by using the compensation signal generator 68 which produces a compensation signal $-\phi=-\tan^{-1}\omega_0T$ for advancing the output of the multiplier 26 by the amount of the phase characteristic φ of the first-order lag circuit 64 so that the subtracter 69 subtracts $-\tan^{-1}\omega_0T$ from the output of the multiplier 26. Consequently it becomes possible to detect the amplitude V and phase θ of the voltage signal v without a delay.

Embodiment 12

Figure 11:
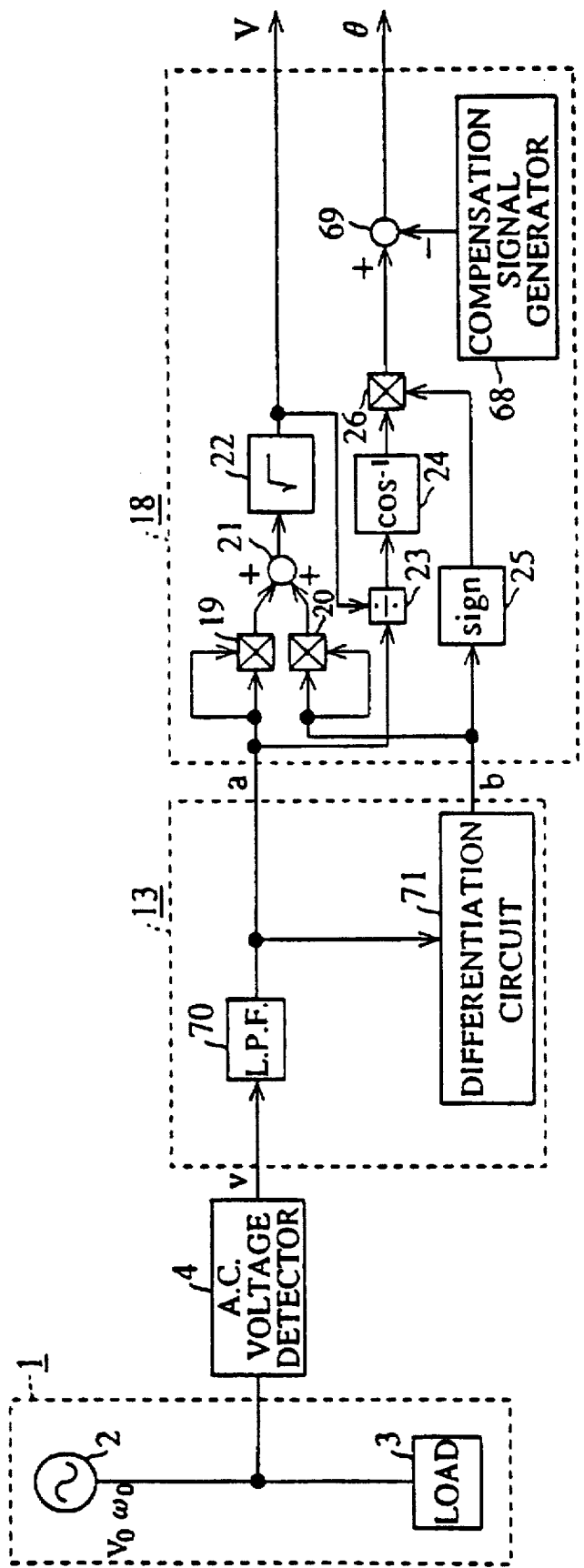
Figure 12:
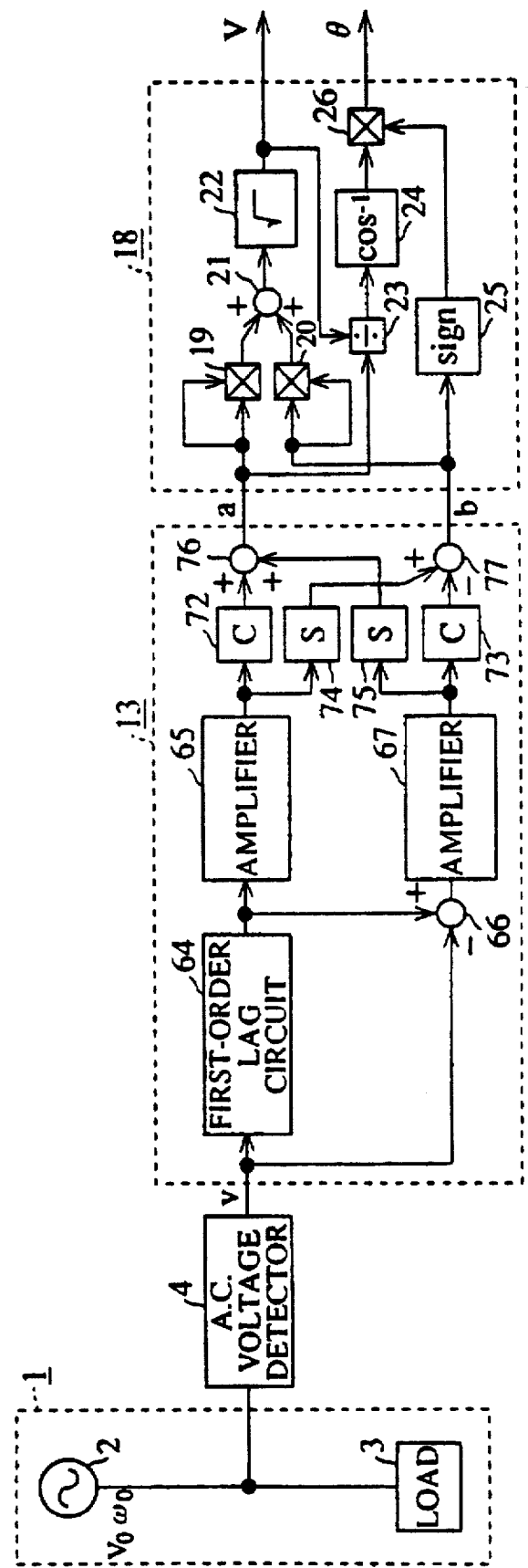

FIG. 11 shows the arrangement of the amplitude and phase detection apparatus based on this invention. In the figure, indicated by 70 is a low-pass filter which eliminates harmonics included in the voltage signal v that is detected by the a.c. voltage detector 4, and 71 is a differentiation circuit which differentiates the output of the low-pass filter 70.

The voltage signal v detected by the voltage detector 4 is fed to the low-pass filter 70, by which harmonics included in it are eliminated. The voltage signal v without harmonics is delivered as the voltage signal a to the amplitude/phase detection means 18 and also fed to the differentiation circuit 71. The differentiation circuit 71 differentiates the voltage signal v to produce the voltage signal b, which is delivered to the amplitude/phase detection means 18.

Since the voltage signal b is the result of differentiation of the voltage signal a, these signals are out of phase with each other by 90°. Accordingly, the amplitude V and phase θ of the voltage signal v can be detected based on the voltage signals a and b, as in Embodiment 1. In this case, however, the phase lags by the amount of the phase characteristic of the low-pass filter 70, as in the case of the first-order lag circuit 64 of Embodiment 11, and the compensation signal generator 68 produces a compensation signal $-\phi=-\tan^{-1}\omega_0T$ for advancing the phase by the amount of the phase characteristic φ thereby to offset the phase lag.

Consequently, it becomes possible to detect the amplitude V and phase θ of the voltage signal v without a phase lag.

Embodiment 13

FIG. 11 shows the arrangement of the amplitude and phase detection apparatus based on this invention. In the figure, indicated by 72 and 73 are amplifiers having a gain set to cos φ, i.e., the cosine of the phase characteristic φ (phase difference) of the first-order lag circuit 64, 74 and 75 are amplifiers having a gain set to sin φ, i.e., the sine of the phase characteristic φ (phase difference) of the circuit 64, 76 is an adder which sums the outputs of the amplifiers 72 and 75, and 77 is a subtracter which subtracts the output of the amplifier 73 from the output of the amplifier 74.

The amplifiers 72–75, adder 76 and subtracter 77 in combination constitute a rotational transformation circuit, which implements the rotational transformation for the outputs of the amplifiers 65 and 67 based on the phase characteristic φ of the first-order lag circuit 64 so that their output phase is advanced by the amount of the phase characteristic φ.

The outputs of the amplifiers 65 and 67 lag from the phase of the voltage signal v by the amount of the phase characteristic φ of the first-order lag circuit 64, as has been explained in Embodiment 11. This embodiment is designed to dissolve the phase lag problem by use of the rotational transformation circuit, which will be explained in detail in the following.

For the voltage signal v=Vcos θ, the amplifierer 65 and 66 produces outputs that depend on the phase characteristic φ of the first-order lag circuit 64 as follows.

Output of amplifier 65=V cos (θ−φ)   (15)

Output of amplifier 67=−V sin (θ−φ)   (16)

The adder 76 sums the outputs of the amplifiers 72 and 75 to produce an output as follows.

Output of amplifier 76=V cos (θ−φ) cos φ−V sin (θ−φ) sin φ=V cos θ   (17)

The subtracter 77 subtracts the output of the amplifier 73 from the output of the amplifier 74 to produce an output as follows.

Output of subtracter 77=V cos (θ−φ) sin φ+V sin (θ−φ) cos φ=V sin θ   (18)

The comparison of the formulas (15) and (16) with the formulas (17) and (18) reveals that the outputs of the amplifiers 65 and 67 are advanced by the amount of the phase characteristic φ of the first-order lag circuit 64 by the operation of the rotational transformation circuit. Consequently, the phase lag caused by the first-order lag circuit 64 is eliminated, and it becomes possible to detect the amplitude V and phase θ of the voltage signal v without a delay.

Embodiment 14

Figure 13:
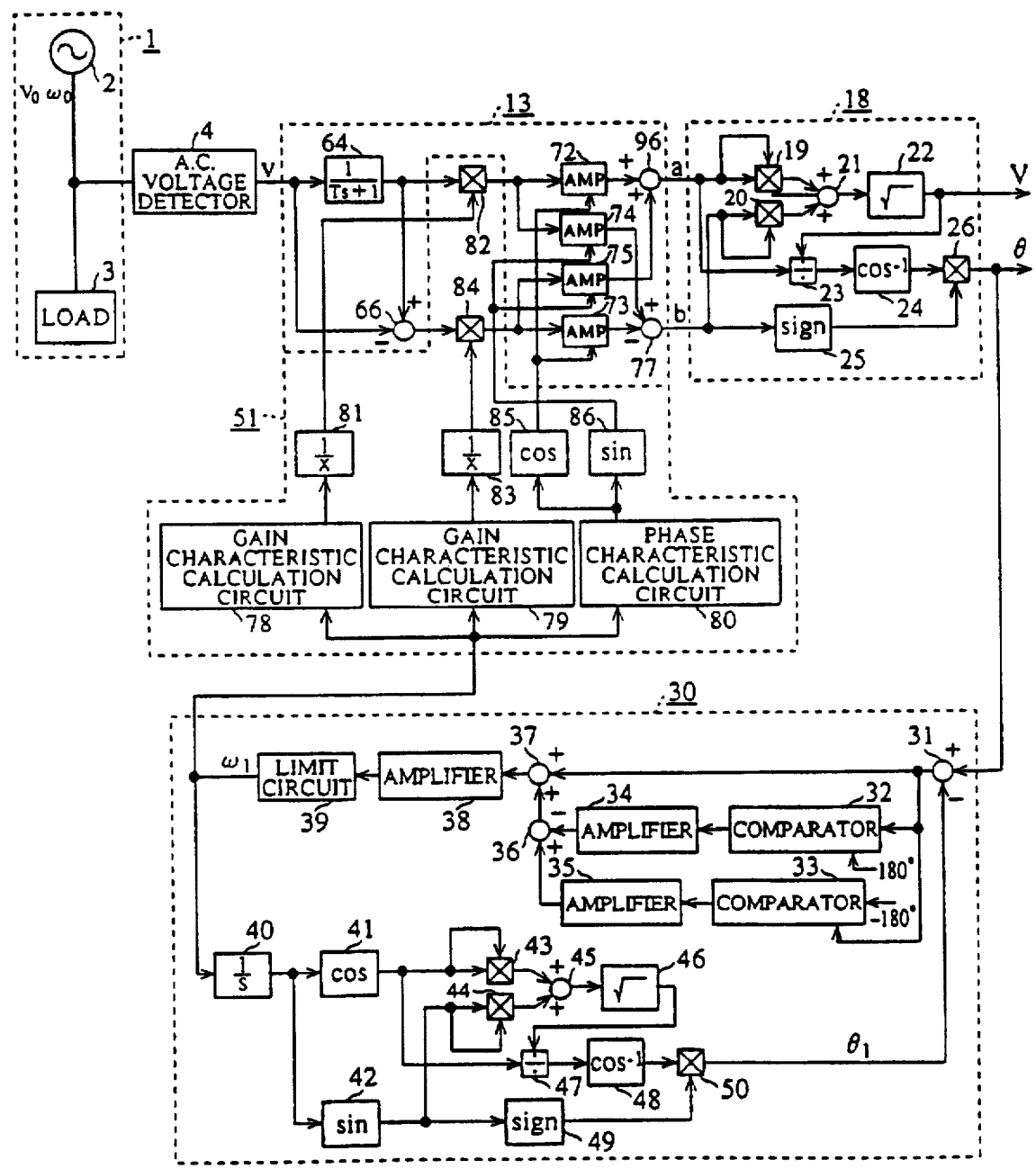

FIG. 13 shows the arrangement of the amplitude and phase detection apparatus based on this invention. In the figure, indicated by 78 is a gain characteristic calculation circuit which calculates the gain characteristic of the first-order lag circuit 64 based on the frequency $\omega_1$ calculated by the frequency calculation means 30, 79 is a gain characteristic calculation circuit which calculates the gain characteristic of the circuit section from the input of the first-order lag circuit 64 up to the output of the subtracter 66 based on the calculated frequency $\omega_1$, and 80 is a phase characteristic calculation circuit which calculates the phase characteristic of the first-order lag circuit 64 based on the calculated frequency $\omega_1$.

Indicated by 81 and 83 are reciprocal calculation circuits which calculate the reciprocal of the gain characteristic calculated by the circuits 78 and 79, 82 is a multiplier which multiplies the output of the reciplocating circuit 81 to the output of the first-order lag circuit 64, 84 is a multiplier which multiplies the output of the reciplocating circuit 83 to the output of the subtracter 66, 85 is a cosine calculation circuit which calculates the cosine of the calculated phase characteristic and provides the result as a multiplication factor for the amplifiers 72 and 73, and 86 is a sine calculation circuit which calculates the sine of the calculated phase characteristic and provides the result as a multiplication factor for the amplifiers 74 and 75.

This embodiment is designed to calculate the frequency $\omega_1$ of the object system 1 by using the frequency calculation means 30 and compensate the gain characteristic and phase characteristic of the first-order lag circuit 64 in response to the frequency variation of the object system 1, as in the case of Embodiment 7.

Specifically, the gain characteristic calculation circuits 78 and 79 calculate the gain characteristics in the same manner as Embodiment 7, the reciplocating circuits 81 and 83 calculate the reciprocal of the gain characteristics, and the multipliers 82 and 84 multiply the outputs of the reciplocating circuits 81 and 83 to the outputs of the first-order lag circuit 64 and subtracter 66, thereby compensating the gain characteristic. Consequently, the gain characteristic of the first-order lag circuit 64 is modified in response to the frequency variation of the object system 1.

The phase characteristic calculation circuit 80 calculates the phase characteristic in the same manner as Embodiment 7, the cosine calculation circuit 85 calculates the cosine of phase characteristic to set the multiplication factor for the amplifiers 72 and 73, and the sine calculation circuit 86 calculates the sine of phase characteristic to set the multiplication factor for the amplifiers 74 and 75, thereby compensating the phase characteristic. Consequently, the phase characteristic of the first-order lag circuit 64 is modified in response to the frequency variation of the object system 1.

Embodiment 15

Figure 14:
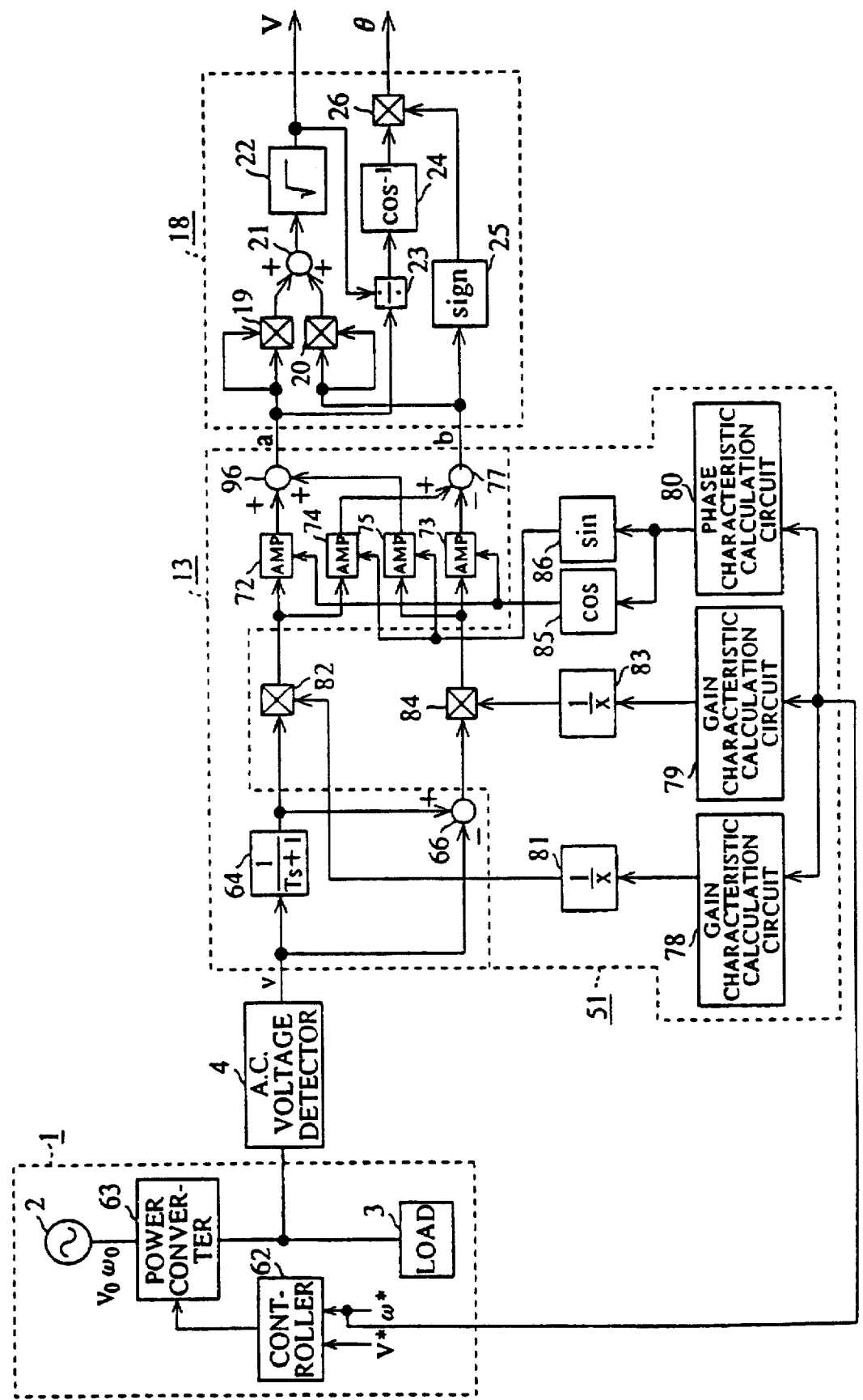
Figure 15:
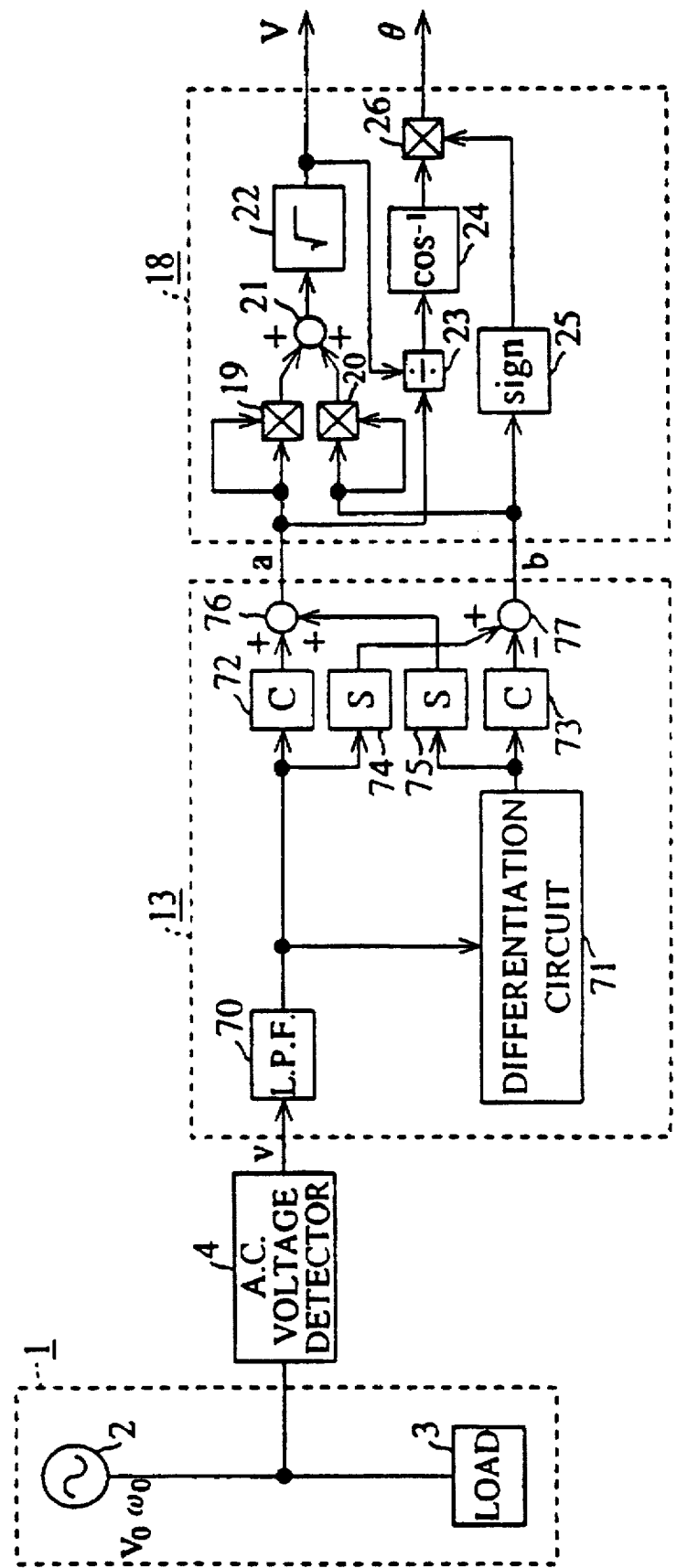

This embodiment is for the case of an object system 1 in which a controller 62 controls the system frequency in response to a frequency command value ω* and a power converter 63 supplies variable-frequency power to the load 3. The compensation means 51 compensates the gain characteristic and phase characteristic of the first-order lag circuit 64 based on the frequency command value ω*, as shown in FIG. 14, in contrast to Embodiment 14 where these characteristic of the first-order lag circuit 64 are compensated based on the evaluated frequency $\omega_1$ of the object system 1. The remaining portion is identical to Embodiment 14, and the explanation thereof is omitted.

This embodiment is capable of detecting the amplitude V and phase θ of the voltage signal v accurately even for an object system which depends on a variable-frequency power source.

Embodiment 16

This embodiment is designed such that a rotational transformation circuit implements the rotational transformation for the outputs of the low-pass filter 70 and differentiation circuit 71 based on the phase characteristic φ of the low-pass filter 70, in contrast to Embodiment 13 where the rotational transformation circuit implements the rotational transformation for the outputs of the amplifiers 65 and 67 based on the phase characteristic φ of the first-order lag circuit 64, and the same effectiveness as of Embodiment 13 is achieved.

Embodiment 17

Figure 16:
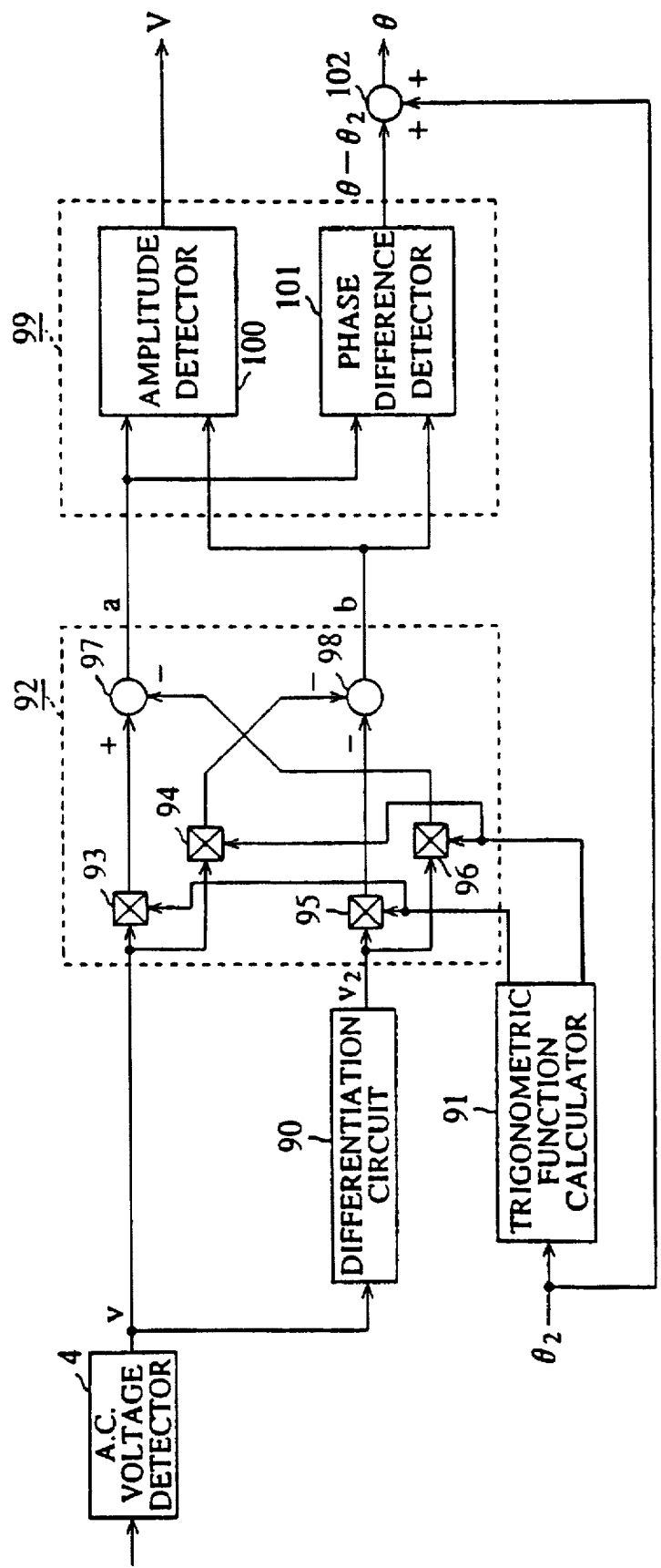

FIG. 16 shows the arrangement of the amplitude and phase detection apparatus based on this embodiment. In the figure, indicated by 90 is a differentiation circuit (differentiation means) which differentiates the voltage signal v that is detected by the a.c. voltage detector 4, 91 is a trigonometric function calculator which calculates the cosine and sine of the reference phase $\theta_2$ of the voltage signal v, 92 is a product-sum calculator (conversion means) which implements the rotational transformation for the outputs of the a.c. voltage detector 4 and differentiation circuit 90 based on the output of the trigonometric function calculator 91 thereby to convert the outputs of the voltage detector 4 and differentiation circuit 90 into a cosine and sine wave components of the voltage signal v, 93 is a multiplier which multiplies the cosine wave component to the voltage signal v, 94 is a multiplier which multiplies the voltage signal v by the sine wave component, 95 is a multiplier which multiplies the voltage signal $v_2$ by the cosine wave component, 96 is a multiplier which multiplies the voltage signal $v_2$ by the sine wave component, 97 is a subtracter which subtracts the output of the multiplier 96 from the output of the multiplier 93, and 98 is an adder which sums the outputs of the multipliers 94 and 95 and produces an inverted output.

Indicated by 99 is an amplitude/phase difference detection means which implements the polar coordinate transformation for the cosine wave component a and sine wave component b of the voltage signal v provided by the calculator 92 thereby to detect the amplitude V of the voltage signal v and also implements the detection of the phase difference $\theta-\theta_2$ between the phase $\theta$ of the signal v and the reference phase $\theta_2$, and 100 is an amplitude detector in the amplitude/phase difference detection means 99, consisting of multipliers 19 and 20, adder 21 and square root calculation circuit 22 (refer to FIG. 1).

Indicated by 101 is a phase difference detector in the amplitude/phase difference detection means 99, consisting of a divider 23, inverse-cosine calculation circuit 24, polarity calculation circuit 25 and multiplier 26 (refer to FIG. 1), and 102 is an adder (summing means) which adds the reference phase $\theta_2$ to the phase difference $\theta-\theta_2$ detected by the phase difference detector 101.

The a.c. voltage detector 4 detects the voltage signal v, and the differentiation circuit 90 differentiates the signal v to produce a voltage signal $v_2$ that is out of phase with the signal v by 90°. Specifically, for the voltage signal $v=V \cos \theta$, a voltage signal $v_2=-\sin\theta$ is produced. The trigonometric function calculator 91 calculates the $\cos\theta_2$ and $\sin\theta_2$ for the reference phase $\theta_2$ of the voltage signal v. The reference phase $\theta_2$ is the phase of the rated frequency of the object system 1 (generally 50 Hz or 60 Hz), and therefore it is specific to the system.

The product-sum calculator 92 implements the rotational transformation for the voltage signals v and $v_2$ based on $\cos\theta_2$ and $\sin\theta_2$ to convert the voltage signals v and $v_2$ into the cosine wave component a and sine wave component b of the voltage signal v. In this case, the calculator 92 delays the phases of the signals v and $v_2$ by the amount of the reference phase $\theta_2$ through the rotational transformation in order that the amplitude/phase difference detection means 99 of the following stage can detect the phase difference $\theta-\theta_2$ between the phase $\theta$ of voltage signal v and the reference phase $\theta_2$.

The rotational transformation implemented by the calculator 92 is expressed in formulas as follows.

Output a of subtracter $97 = V \cos\theta \cos\theta_2 + V \sin\theta \sin\theta_2 = V \cos(\theta-\theta_2)$ (19)

Output b of adder $98 = V \cos(\theta-\phi) \sin\phi + V \sin(\theta-\phi) \cos\phi = V \sin(\theta-\theta_2)$ (20)

The amplitude/phase difference detection means 99 implements the polar coordinate transformation for the voltage signals a and b provided by the calculator 92 thereby to detect the amplitude V of the voltage signal v and detect the phase difference $\theta-\theta_2$ (for a detailed explanation of operation, refer to Embodiment 1). The adder 102 adds the reference phase $\theta_2$ to the difference $\theta-\theta_2$ that is provided by the phase difference detector 101 thereby to evaluate the phase $\theta$ of the voltage signal v.

Consequently, this embodiment is capable of detecting the amplitude V and phase $\theta$ of the voltage signal v without a phase lag.

Embodiment 18

Figure 17:
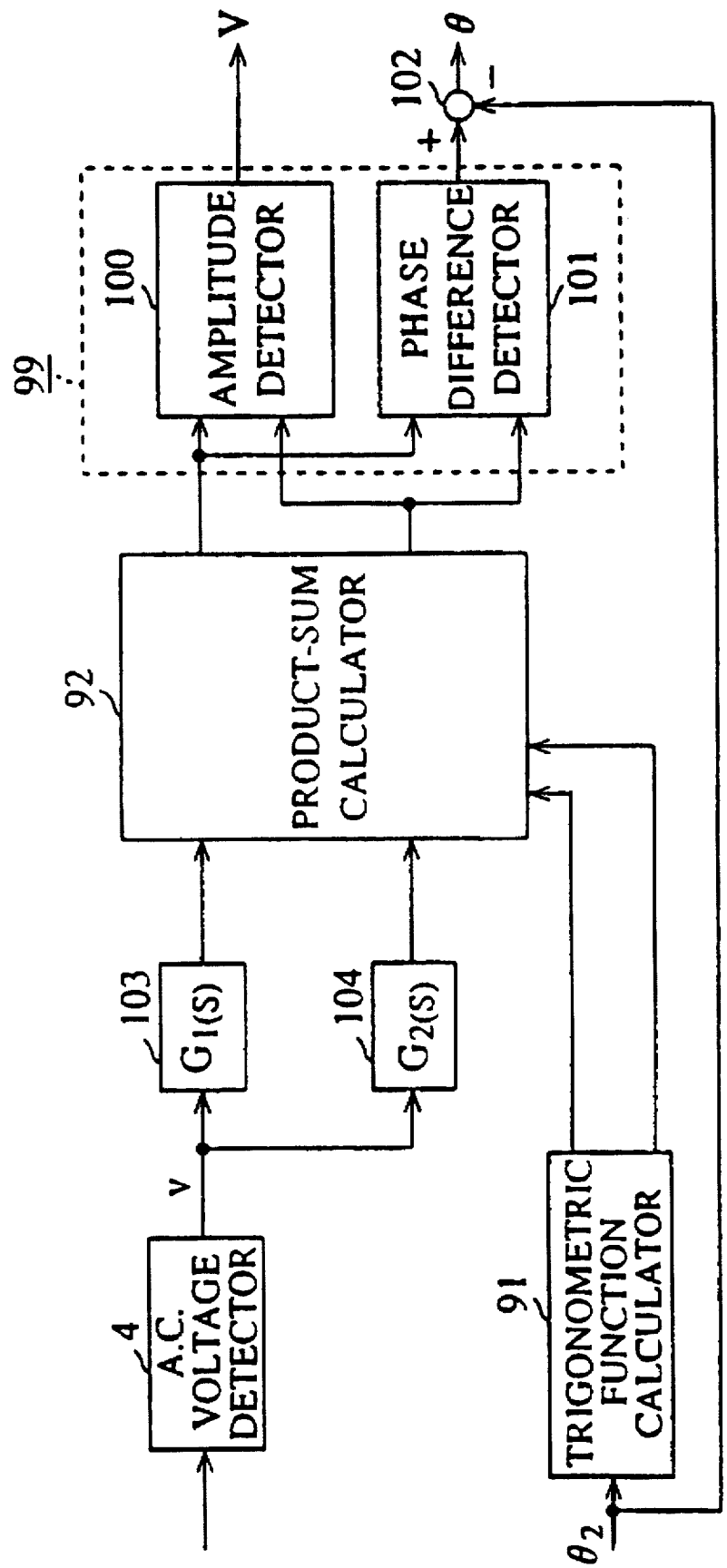

This embodiment, which is derived from Embodiment 17 where the product-sum calculator 92 implements the rotational transformation for the outputs of the a.c. voltage detector 4 and differentiation circuit 90, employs a filter (first-order lag circuit) 103 which receives the voltage signal v from the detector 4 and a phase-lead filter (first-order lead circuit) 104 which produces a voltage signal that leads the phase of the output of the filter 103 by 90°, as shown in FIG. 17, in place of the differentiation circuit 90 of Embodiment 17. The product-sum calculator 92 implements the rotational transformation for the outputs of the filters 103 and 104, and the same effectiveness as of Embodiment 17 is achieved.

The phase-lag filter 103 and phase-lead filter 104 have their transfer functions $G_1(s)$ and $G_2(s)$ set, for example, as follows.

$$G_1(s) = Ka/(sT+1) \quad (21)$$

where $$Ka = \{1+(\omega_0 T)^2\}^{1/2} G_2(s) = KbsT/(sT+1) \quad (22)$$

where $Kb = \{1+(\omega_0 T)^2\}^{1/2}/\omega_0 T$

Since $G_1(s)/G_2(s)$ is equal to sT, the outputs of the phase-lag filter 103 and phase-lead filter 104 have a phase difference of 90°. Accordingly, by feeding the outputs of the filters 103 and 104 to the product-sum calculator 92, it becomes possible to detect the amplitude V and phase $\theta$ of the voltage signal v without a phase lag, as in the case of Embodiment 17.

This embodiment does not need a differentiation circuit, and therefore it is immune to noise.

Embodiment 19

Figure 18:
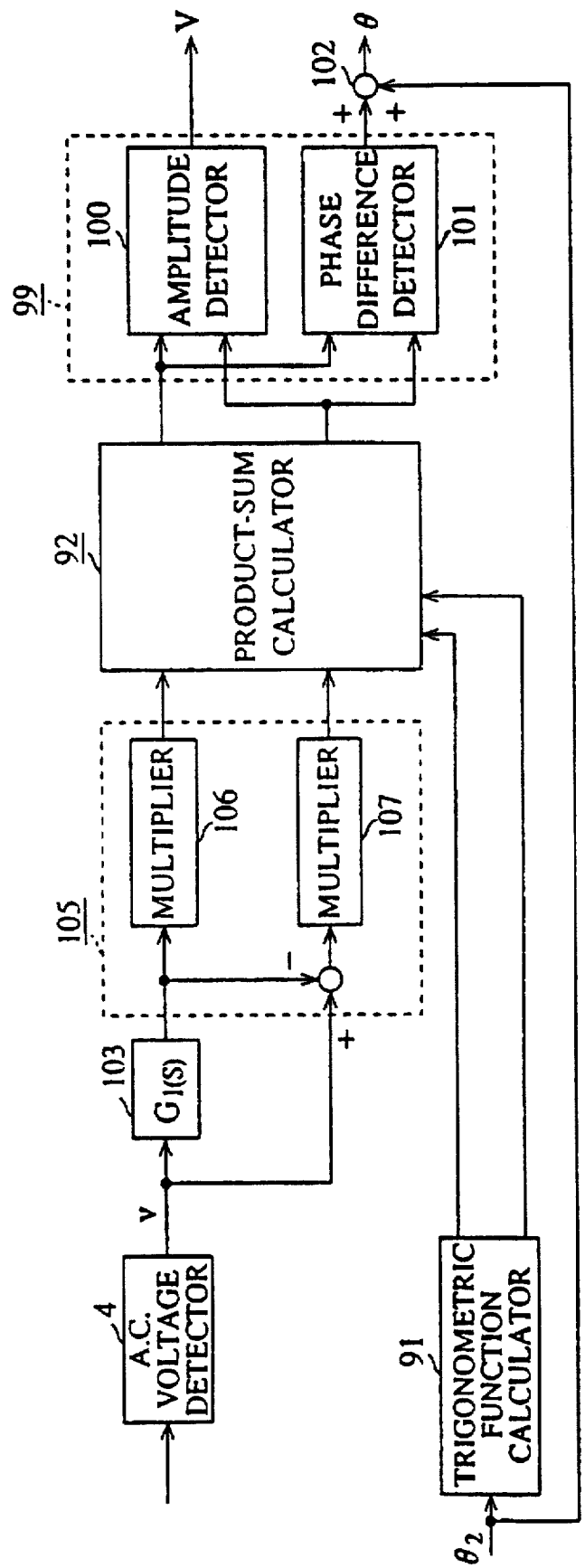

This embodiment, which is derived from Embodiment 17 where the product-sum calculator 92 implements the rotational transformation for the outputs of the a.c. voltage detector 4 and differentiation circuit 90, employs a phase-lag filter 103 which receives the voltage signal v from the voltage detector 4 and a phase difference generation means 105 which subtracts the output of the filter 103 from the detected voltage signal v and multiplies the subtraction result and voltage signal v by the prescribed values Ka and Kb, respectively, as shown in FIG. 18, in place of the differentiation circuit 90 of Embodiment 17. The phase difference generation means 105 consists of a multiplier 106 having a multiplication factor of Ka and another multiplier 107 having a multiplication factor of Kb.

The product-sum calculator 92 implements the rotational transformation for the output of the phase difference generation means 105, and the same effectiveness as of Embodiment 17 is achieved. The reason for the achievement of the same effectiveness as Embodiment 17 by this circuit arrangement is that the formula (22) representing the transfer function $G_2(s)$ of the phase-lead circuit 104 can be reformed as follows.

$$G_2(s) = Kb\, sT/(sT+1) \quad (23)$$
$$= 1 - 1/(sT+1)$$

where $Kb = \{1+(\omega_0 T)^2\}^{1/2}/\omega_0 T$

Embodiment 20

Figure 19:
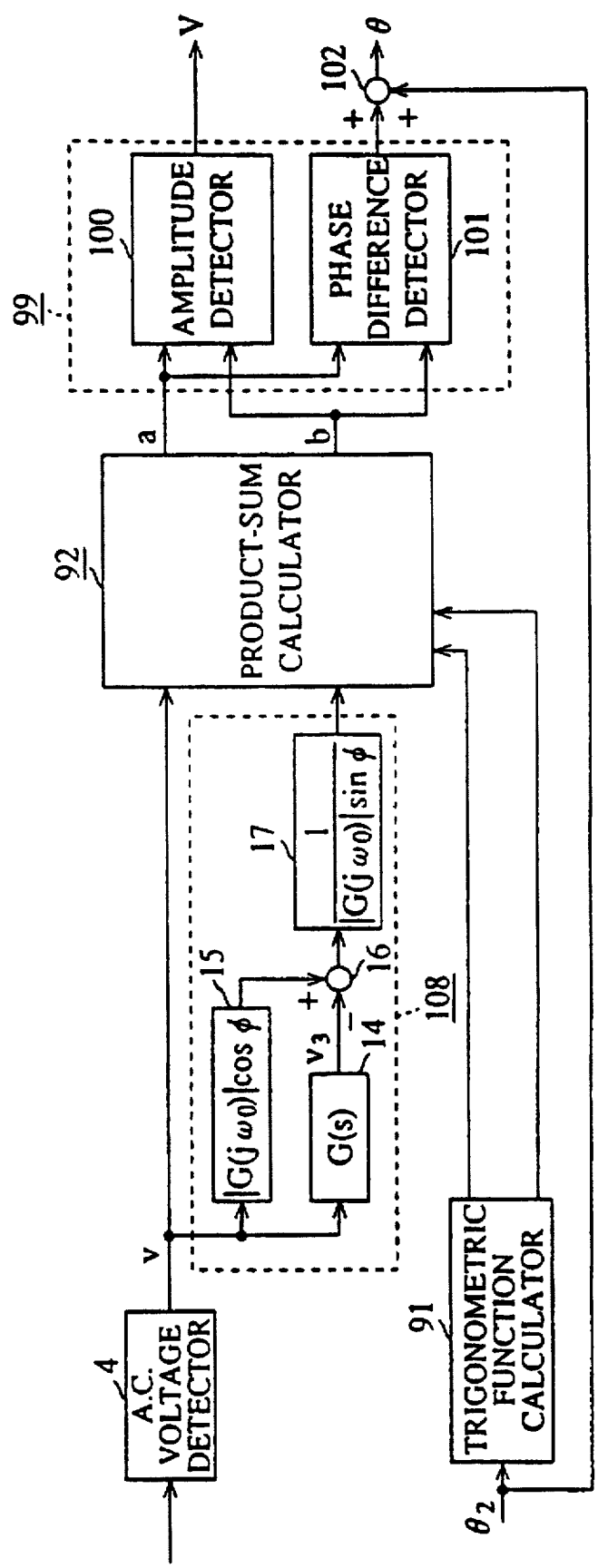

This embodiment, which is derived from Embodiment 17 where the product-sum calculator 92 implements the rotational transformation for the outputs of the a.c. voltage detector 4 and differentiation circuit 90, employs a phase-lead circuit 108 which receives the voltage signal v from the voltage detector 4 and produces a a voltage signal that leads the signal v by 90° as shown in FIG. 19, in place of the differentiation circuit 90 of Embodiment 17. The phase-lead circuit 108 consists of the calculation circuit 14, amplifier 15, subtracter 16 and amplifier 17 used in the signal split circuit 13 of Embodiment 1 (refer to FIG. 1).

Figure 20:
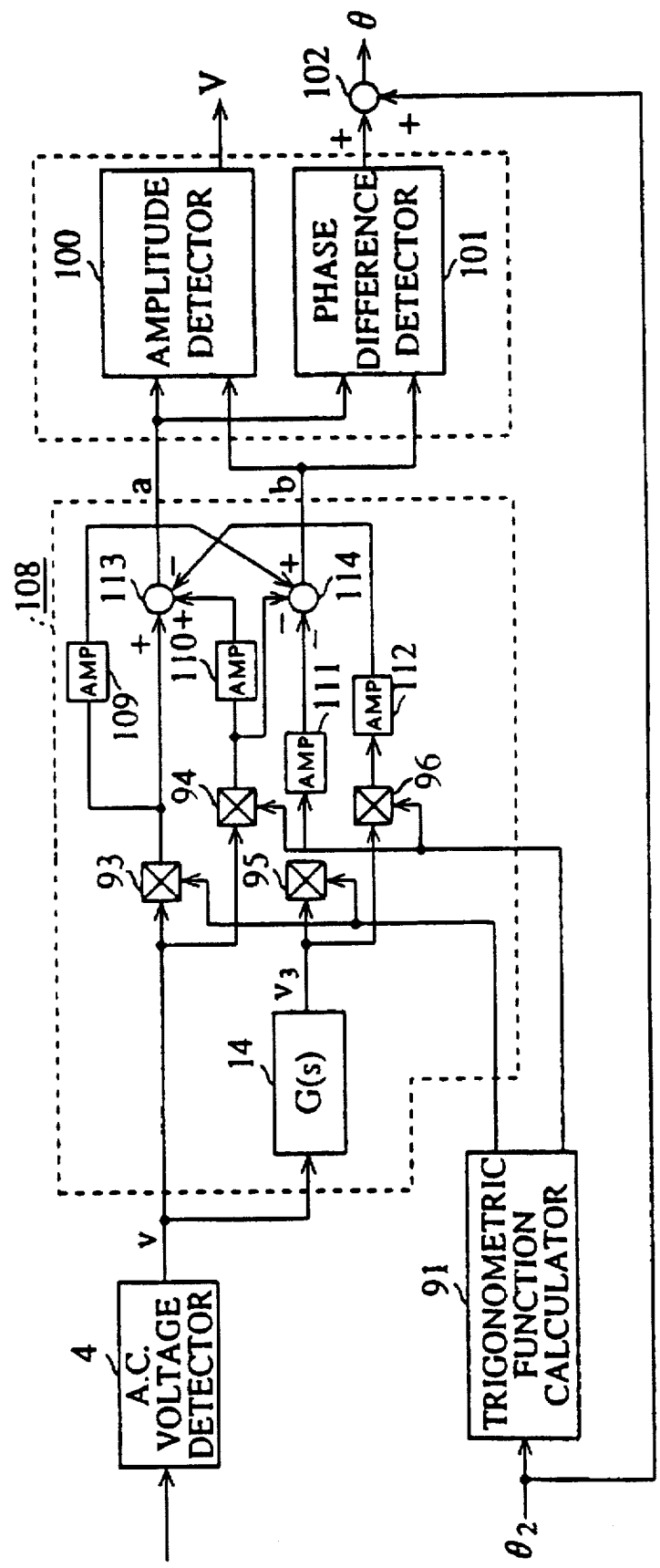

FIG. 20 shows a variant embodiment derived from Embodiment 20, in which indicated by 109 and 110 are amplifiers used to multiply the multiplication factor $\cos\phi/\sin\phi$, 111 and 112 are amplifiers used to multiply a value by the multiplication factor $|G(j\omega_0)|\sin\phi$, and 113 and 114 are adder-subtracters.

Embodiment 21

Figure 21:
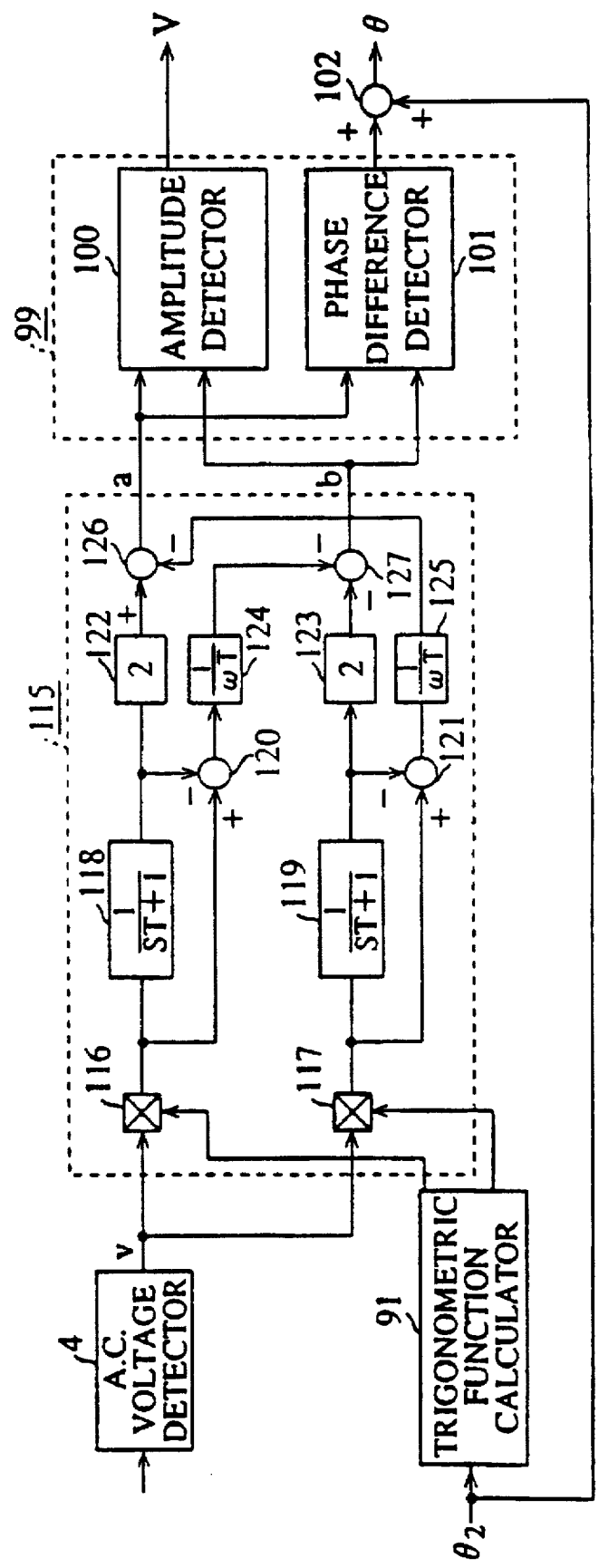
Figure 22:
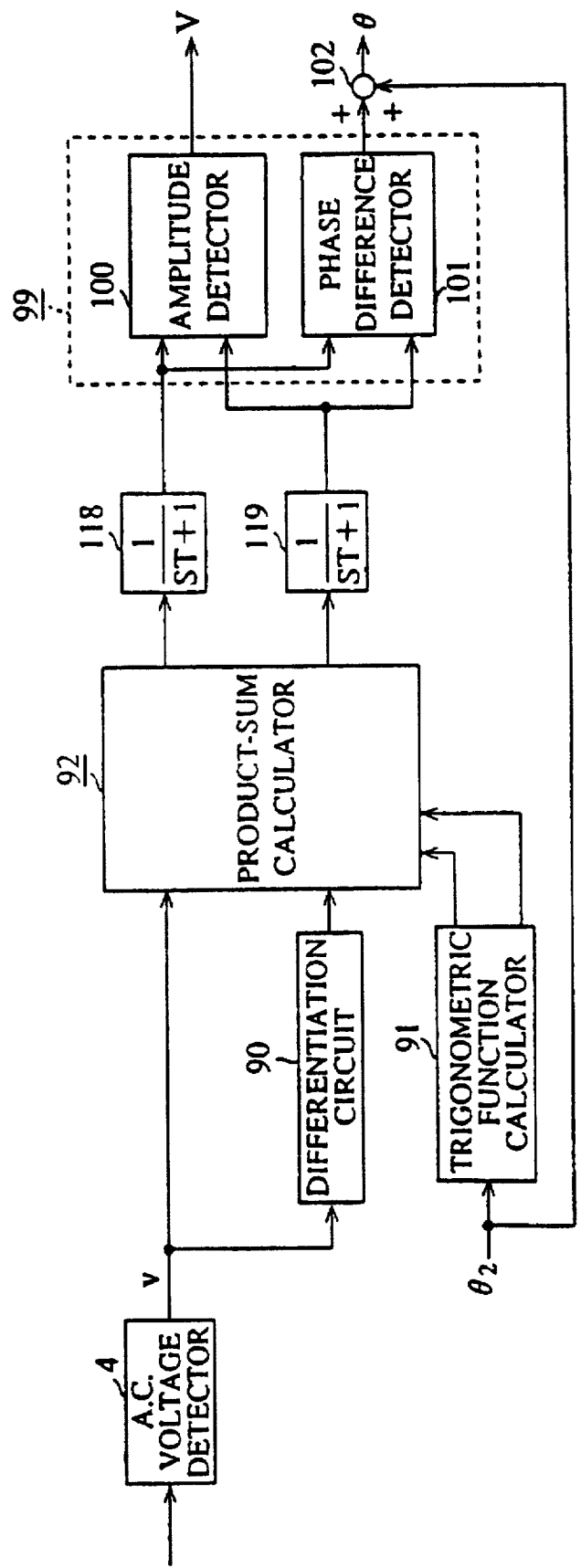

FIG. 21 shows the arrangement of the amplitude and phase detection apparatus based on this embodiment. In the figure, indicated by 115 is a conversion means which multiplies the voltage signal v detected by the voltage detector 4 to the cosine and sine of reference phase θ, feeds the multiplication results to low-pass filters 118 and 119, subtracts the filtered outputs from the respective multiplication results, and calculates the cosine wave component a and sine wave component b of the voltage signal v based on the subtraction results and the filter outputs.

Indicated by 116 is a multiplier which multiplies the cosine of reference phase $\theta_2$ to the detected voltage signal v, 117 is a multiplier which multiplies the sine of reference phase $\theta_2$ to the signal v. 118 and 119 are low-pass filters (first-order lag circuits) each having a transfer function of 1/sT. 120 is a subtracter which subtracts the output of the low-pass filter 118 from the output of the multiplier 116, 121 is a subtracter which subtracts the output of the low-pass filter 119 from the output of the multiplier 117, 122 and 123 are amplifiers which double the outputs of the respective low-pass filters 118 and 119, 124 and 125 are amplifiers which multiply the outputs of the respective multipliers 120 and 121 by 1/ωT. 126 is a subtracter which subtracts the output of the the amplifier 125 from the output of the amplifier 122, and 127 is an adder which sums the outputs of the amplifierer 123 and 124 and produces an inverted output.

This embodiment is similar to Embodiment 18 through Embodiment 20 in that it splits the voltage signal v into signals a and b of 90° phase difference without using a differentiation circuit and detect the phase difference between the phase θ of signal v and the reference phase $\theta_2$ based on the signals a and b. The embodiment differs from the preceding embodiments only in the operation of splitting the voltage signal v into the signals a and b, which is implemented by the conversion means 115.

The conversion means 115 has its function expressed as follows.

$$\begin{bmatrix} a \\ b \end{bmatrix} = \begin{bmatrix} 2/(sT+1) & \{-1+1/(sT+1)\}/\omega T \\ \{-1+1/(sT+1)\}/\omega T & -2/(sT+1) \end{bmatrix} \begin{bmatrix} \cos\theta_2 \\ \sin\theta_2 \end{bmatrix} v \quad (24)$$

$$= \begin{bmatrix} 2 \cdot \frac{(\cos\theta_2)v}{sT+1} - \frac{(\sin\theta_2)v}{\omega T} + \frac{1}{\omega T} \cdot \frac{(\sin\theta_2)v}{sT+1} \\ \frac{(\cos\theta_2)v}{\omega T} + \frac{1}{\omega T} \cdot \frac{(\cos\theta_2)v}{sT+1} - 2 \cdot \frac{(\sin\theta_2)v}{sT+1} \end{bmatrix}$$

Substituting v=V cos θ, and rearranging the formula (24) results as follows.

$$\begin{bmatrix} a \\ b \end{bmatrix} = \begin{bmatrix} 2 \cdot \frac{\cos\theta_2}{sT+1} \cdot v\cos\theta - \frac{\sin\theta_2}{\omega T} \cdot v\cos\theta + \frac{1}{\omega T} \cdot \frac{\sin\theta_2}{sT+1} \cdot v\cos\theta \\ \frac{\cos\theta_2}{\omega T} \cdot v\cos\theta + \frac{1}{\omega T} \cdot \frac{\cos\theta_2}{sT+1} \cdot v\cos\theta - 2 \cdot \frac{\sin\theta_2}{sT+1} \cdot v\cos\theta \end{bmatrix} \quad (25)$$

$$= \begin{bmatrix} v\cos(\theta - \theta_2) \\ v\sin(\theta - \theta_2) \end{bmatrix}$$

The formula (25) reveals that the voltage signal v can be converted into two voltage signals a and b that are out of phase with each other by 90° by the conversion means 115. Accordingly, the amplitude V and phase ω of the voltage signal v can be detected based on the signals a and b, as in Embodiment 17 through Embodiment 20.

Embodiment 22

This embodiment, which is derived from Embodiment 17 where the amplitude/phase difference detection means 99 implements the polar coordinate transformation for the voltage signals a and b provided by the product-sum calculator 92, employs low-pass filters 118 and 119 which receive the voltage signals a and b, with the outputs thereof being rendered the polar coordinate transformation.

This embodiment is capable of eliminating harmonics included in the signals a and b without the imposition of a phase lag, because the signals a and b produced by the product-sum calculator 92 are d.c. signals.

What is claimed is:

1. An apparatus for detecting the amplitude and phase of an a.c. signal in an object system, said apparatus comprising:

a.c. signal detection means for detecting the a.c. signal of said object system;

a first-order lag circuit which receives the detected a.c. signal and provides an output signal having a phase that lags the phase of the a.c. signal;

a first-order lead circuit which receives the detected a.c. signal and produces an a.c. output signal having a phase that leads the phase of the output signal of said first-order lag circuit by 90°;

conversion means for converting the output signals of said first-order lag circuit and first-order lead circuit into cosine and sine wave components of the a.c. signal through a rotational transformation based on a reference phase of the a.c. signal;

amplitude and phase difference detection means which implements a polar coordinate transformation for the converted cosine and sine wave components of the a.c. signal to detect the amplitude of the a.c. signal, and to detect the phase difference between the phase of the a.c. signal and the reference phase; and adding means for adding the reference phase to the detected phase difference.

2. An apparatus for detecting the amplitude and phase of an a.c. signal in an object system, said apparatus comprising:

a.c. signal detection means for detecting the a.c. signal of said object system and for providing a detected a.c. output signal;

a phase-lead circuit which receives the detected a.c. output signal and produces an a.c. output signal that leads the phase of the detected a.c. signal by 90°;

conversion means for converting the outputs of said signal detection means and phase-lead circuit into cosine and sine wave components of the a.c. signal through a rotational transformation based on a reference phase of the a.c. signal;

amplitude and phase difference detection means which implements a polar coordinate transformation for the converted cosine and sine wave components of the a.c. signal to detect the amplitude of the a.c. signal, and to detect the phase difference between the phase of the a.c. signal and the reference phase; and adding means for adding the reference phase to the detected phase difference.

3. An amplitude and phase detection apparatus according to any of claims 1 and 2 further including a low-pass filter for eliminating harmonics included in the cosine and sine wave components of the a.c. signal.

4. A method for detecting amplitude and phase of an a.c. signal, the method comprising steps of:

detecting the a.c. signal;

splitting the detected a.c. signal into a first detected a.c. signal and a second detected a.c. signal having respective phases;

providing a phase lead to the second detected a.c. signal such that the phase of the second detected a.c. signal leads the phase of the first detected a.c. signal;

using a signal representative of a reference phase of the a.c. signal, converting the second detected a.c. signal and the first detected a.c. signal into sine wave and cosine wave components;

providing a polar coordinate transformation of the sine wave and cosine wave components to produce a first signal representative of the amplitude of the a.c. signal and a second signal representative of the difference between the phase of the a.c. signal and the reference phase; and adding the reference phase to the second signal to generate a signal representative of the phase of the a.c. signal.

5. The method of claim 4, further comprising a step of providing a phase lag to the first detected a.c. signal such that the second detected a.c. signal leads the first detected a.c. signal by a phase of approximately 90 degrees.

6. The method of claim 4, further comprising a step of low pass filtering the a.c. signal.

* * * * *